(12) United States Patent
Takeshita et al.

(10) Patent No.: US 11,444,097 B2
(45) Date of Patent: Sep. 13, 2022

(54) MANUFACTURING METHOD OF SEMICONDUCTOR MEMORY DEVICE AND SEMICONDUCTOR MEMORY DEVICE

(71) Applicant: Kioxia Corporation, Minato-ku (JP)

(72) Inventors: Shunpei Takeshita, Yokkaichi (JP); Naoki Yamamoto, Kuwana (JP); Kojiro Shimizu, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/009,202

(22) Filed: Sep. 1, 2020

(65) Prior Publication Data
US 2021/0265378 A1 Aug. 26, 2021

(30) Foreign Application Priority Data
Feb. 21, 2020 (JP) .............................. JP2020-028216

(51) Int. Cl.
| | | |
|---|---|---|
| H01L 27/11578 | (2017.01) | |
| H01L 23/522 | (2006.01) | |
| H01L 23/528 | (2006.01) | |
| H01L 27/11551 | (2017.01) | |
| G11C 8/14 | (2006.01) | |
| H01L 39/24 | (2006.01) | |

(Continued)

(52) U.S. Cl.
CPC .......... *H01L 27/11578* (2013.01); *G11C 8/14* (2013.01); *H01L 21/0268* (2013.01); *H01L 21/0273* (2013.01); *H01L 23/528* (2013.01); *H01L 23/5226* (2013.01); *H01L 27/11519* (2013.01); *H01L 27/11551* (2013.01); *H01L 27/11565* (2013.01); *H01L 39/2467* (2013.01)

(58) Field of Classification Search
CPC ........... H01L 27/11578; H01L 21/0268; H01L 21/0273; H01L 23/5226; H01L 23/528; H01L 27/11519; H01L 27/11551; H01L 27/11565; H01L 39/2467; H01L 27/11556; H01L 27/11582; H01L 21/76805; H01L 21/76816; H01L 21/76831
See application file for complete search history.

(56) References Cited

U.S. PATENT DOCUMENTS 7,855,457 B2    12/2010   Mizukami et al.
2018/0374866 A1* 12/2018   Makala ............. H01L 21/31122
(Continued)

FOREIGN PATENT DOCUMENTS

JP          2019-57623 A    4/2019

*Primary Examiner* — Galina G Yushina
(74) *Attorney, Agent, or Firm* — Oblon, McClelland, Maier & Neustadt, L.L.P.

(57) ABSTRACT

A manufacturing method of a semiconductor memory device in an embodiment, includes: forming a first mask pattern having a first opening and a plurality of second openings above a stacked body; forming a second mask pattern covering some of the plurality of second openings; and etching the stacked body with the first mask pattern as a mask while sequentially exposing the plurality of second openings by causing an end of the second mask pattern to retreat to form a first hole extending in the stacked body in a stacking direction of the stacked body at a position of the first opening and form a plurality of second holes extending in the stacked body to different depths in the stacking direction at positions of the plurality of second openings, and reaching first layers of a plurality of first layers at different levels.

14 Claims, 24 Drawing Sheets

(51) Int. Cl.
*H01L 21/02* (2006.01)
*H01L 27/11565* (2017.01)
*H01L 27/11519* (2017.01)
*H01L 21/027* (2006.01)

(56) References Cited

U.S. PATENT DOCUMENTS

2019/0013327 A1* 1/2019 He .................. H01L 27/1157
2019/0027489 A1* 1/2019 Orimoto ........... H01L 27/11519
2019/0088672 A1* 3/2019 Tomimatsu ....... H01L 27/11565
2020/0098781 A1* 3/2020 Xiao ................ H01L 27/11556

* cited by examiner

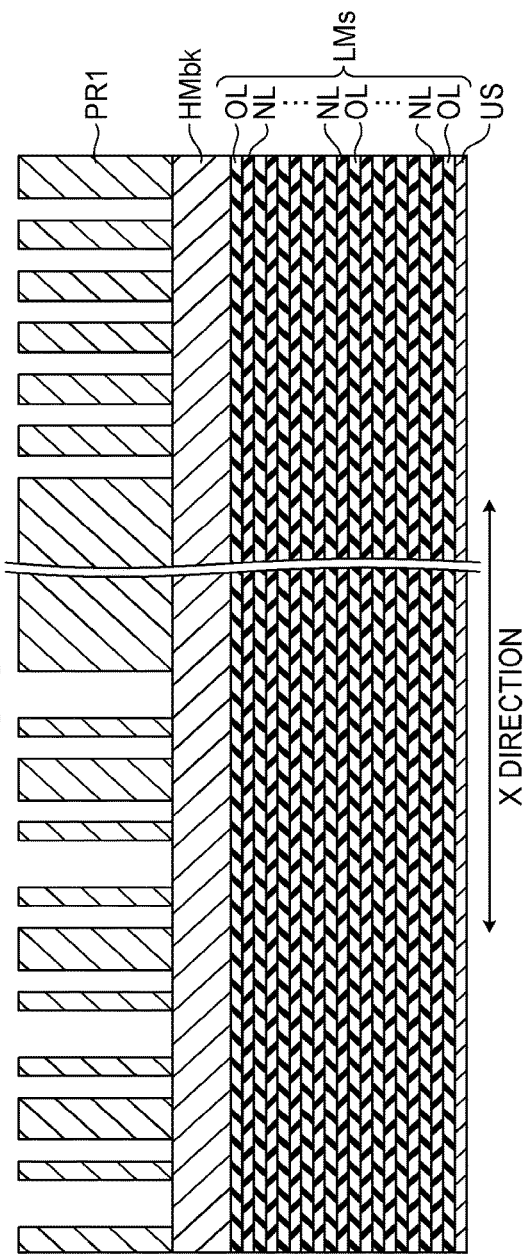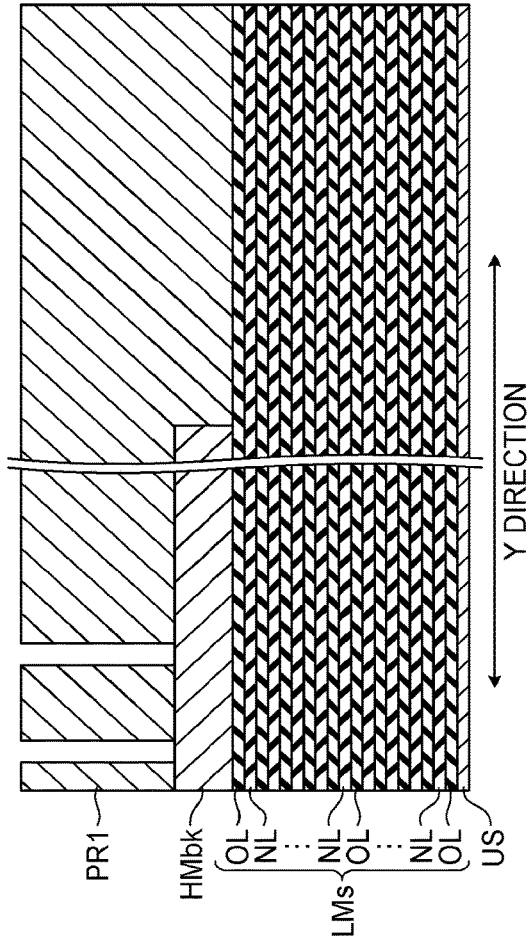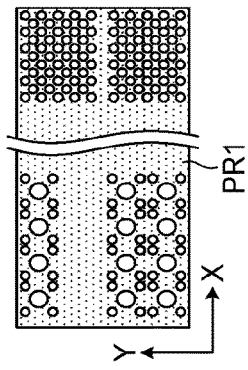

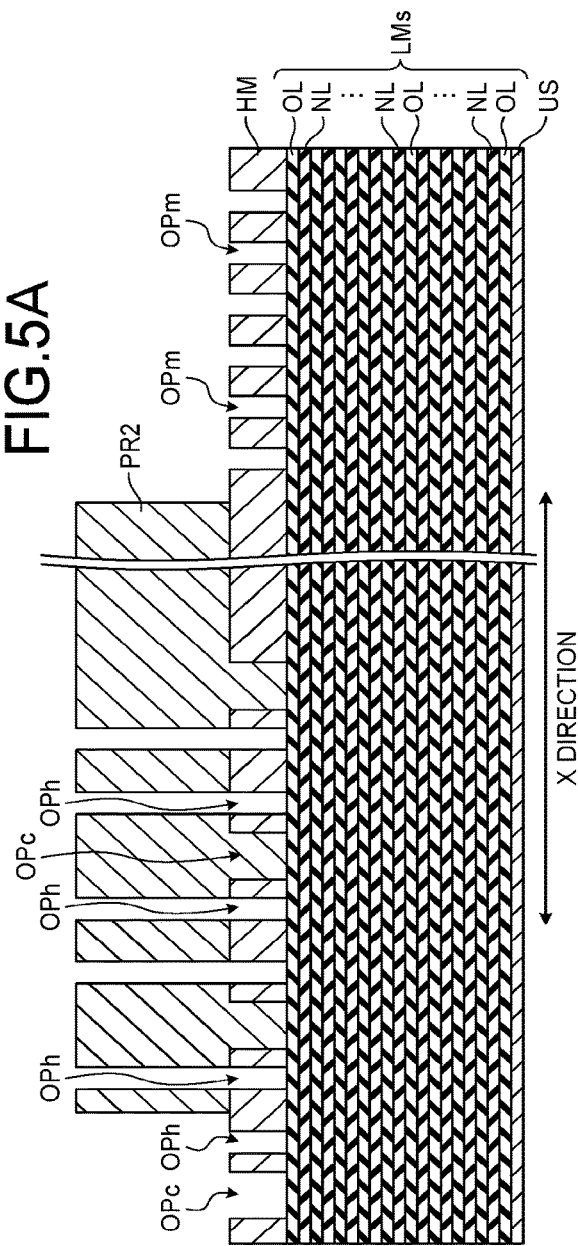
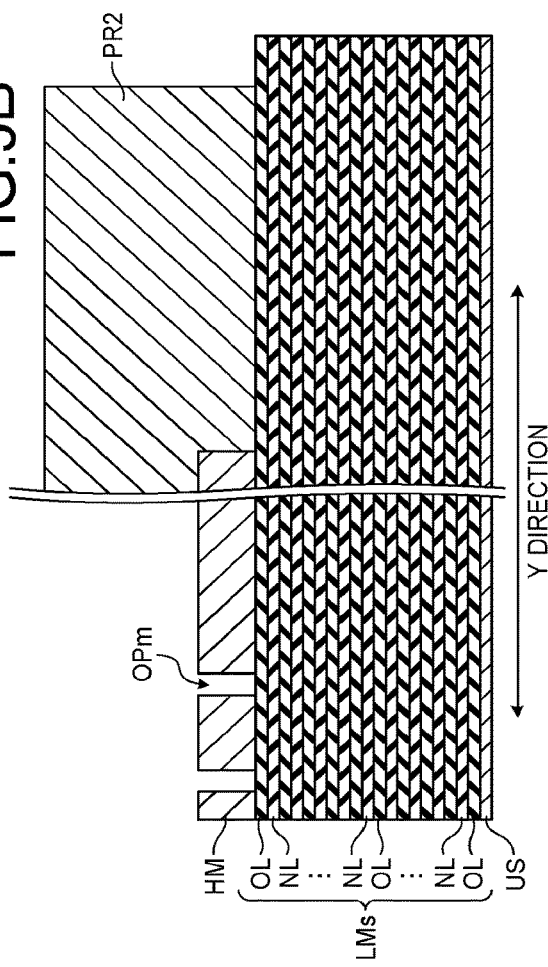
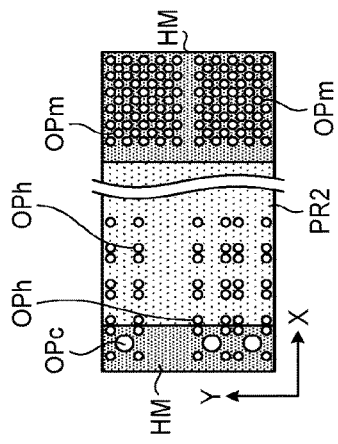
FIG.5A
FIG.5B
FIG.5C

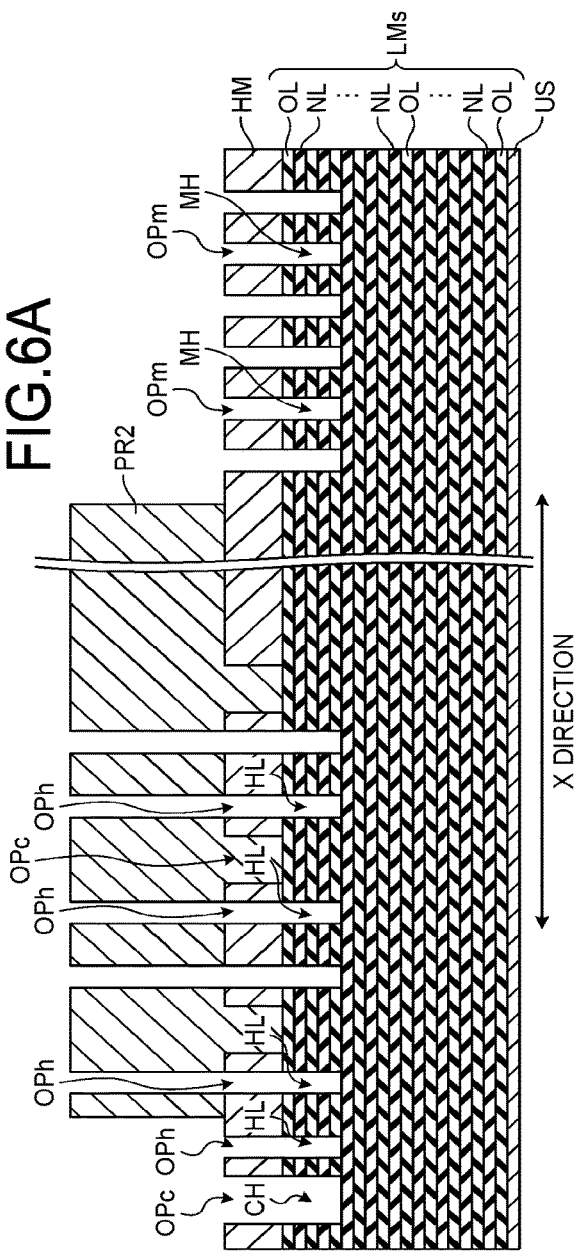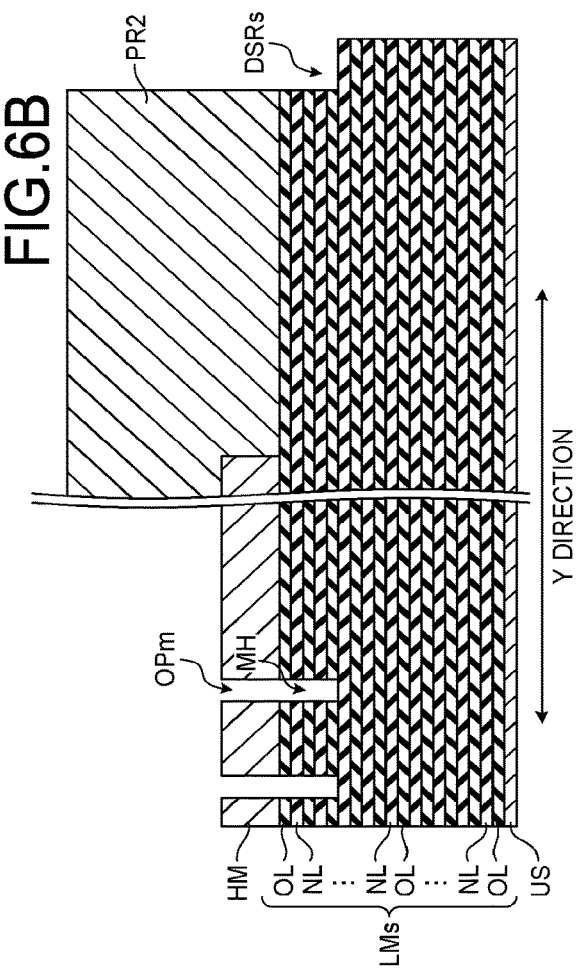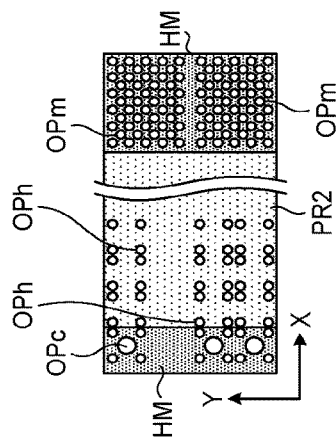

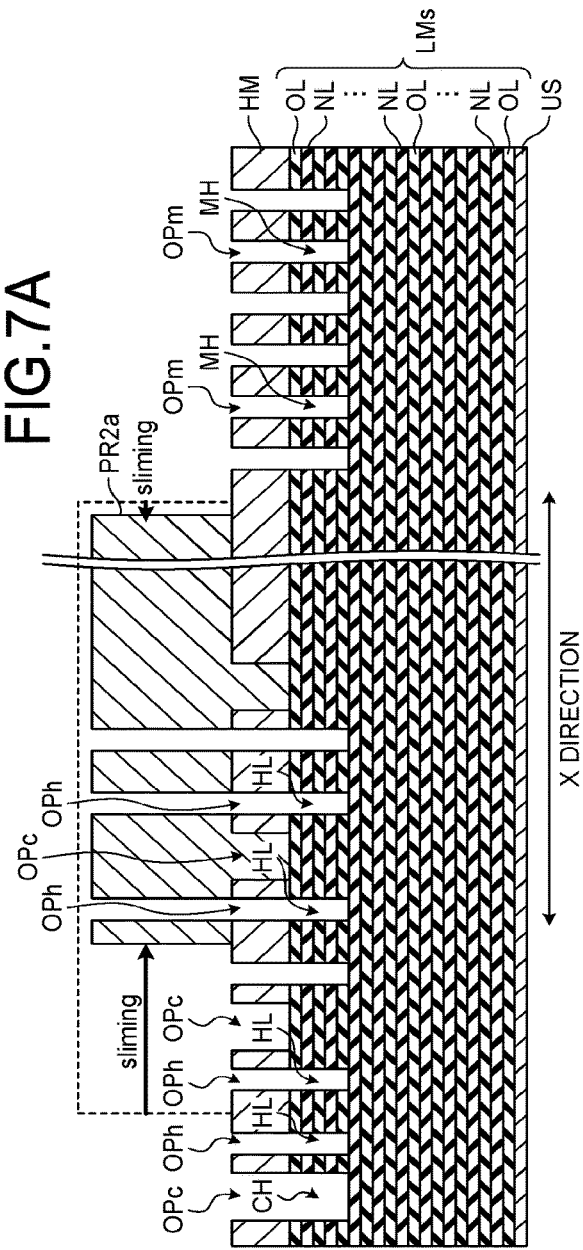
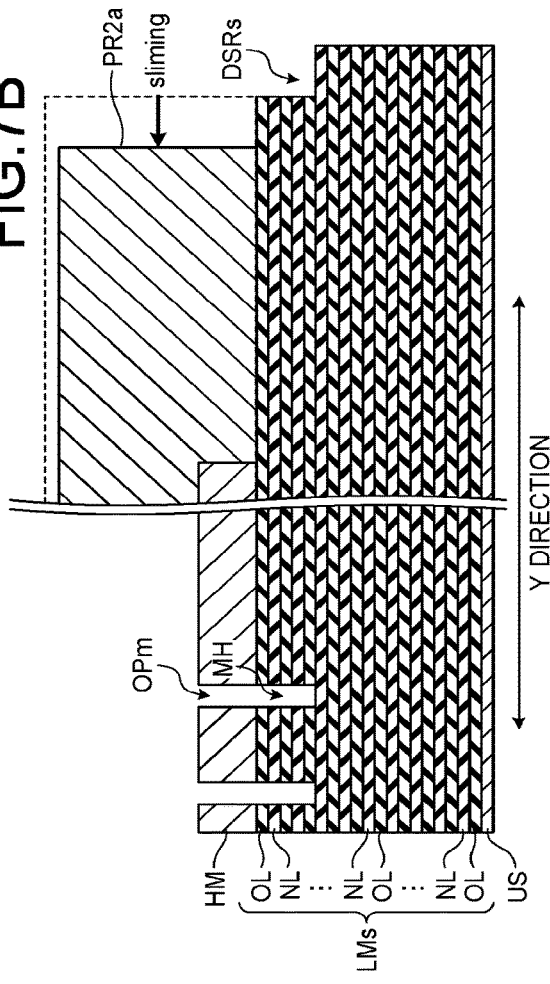
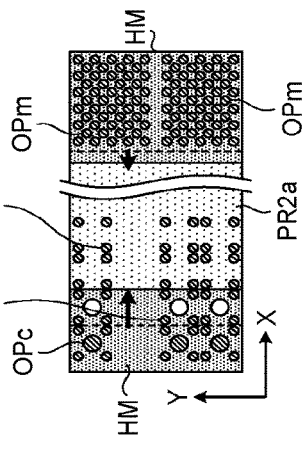
FIG.7A
FIG.7B
FIG.7C

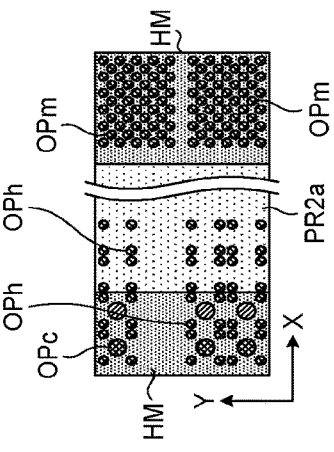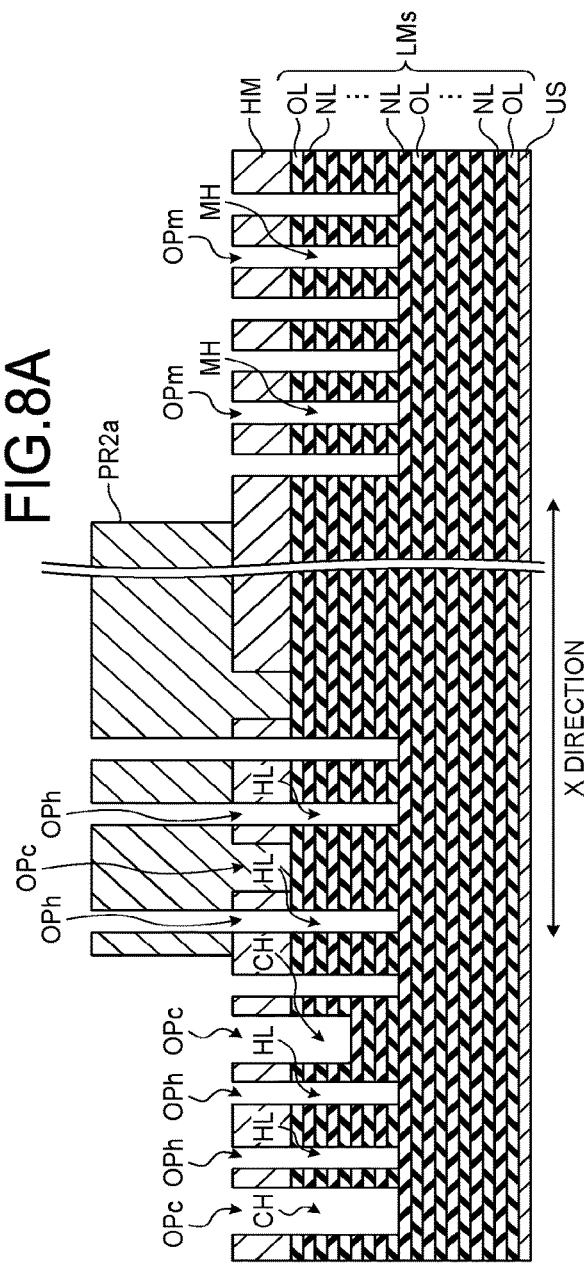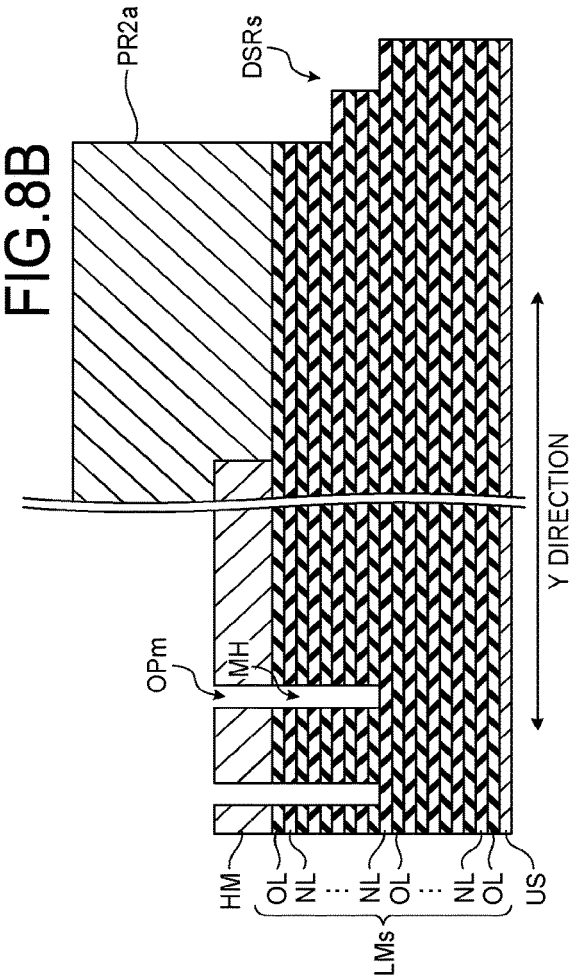

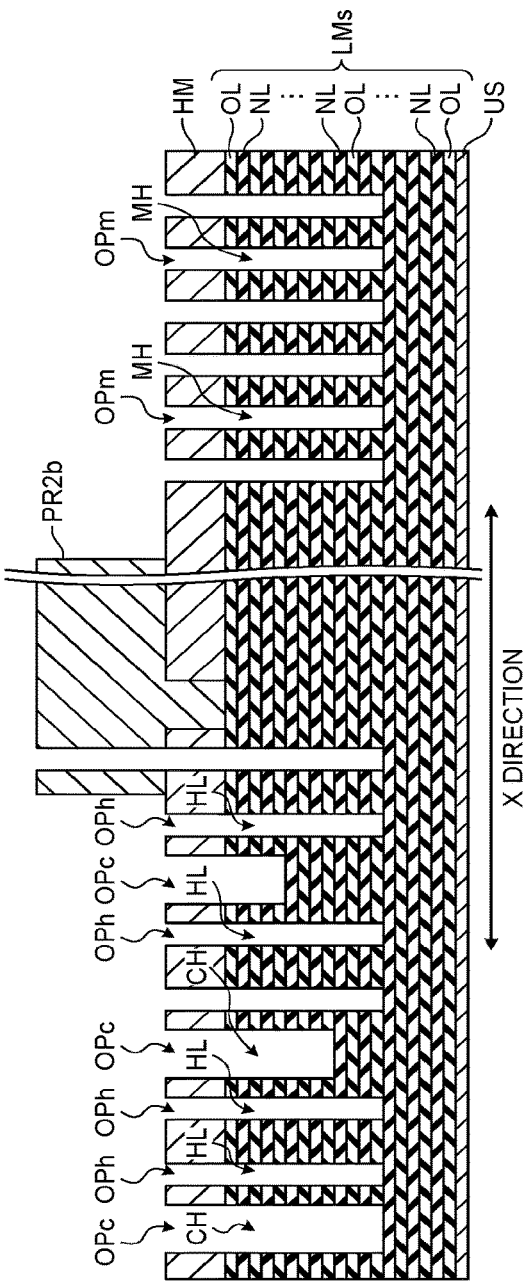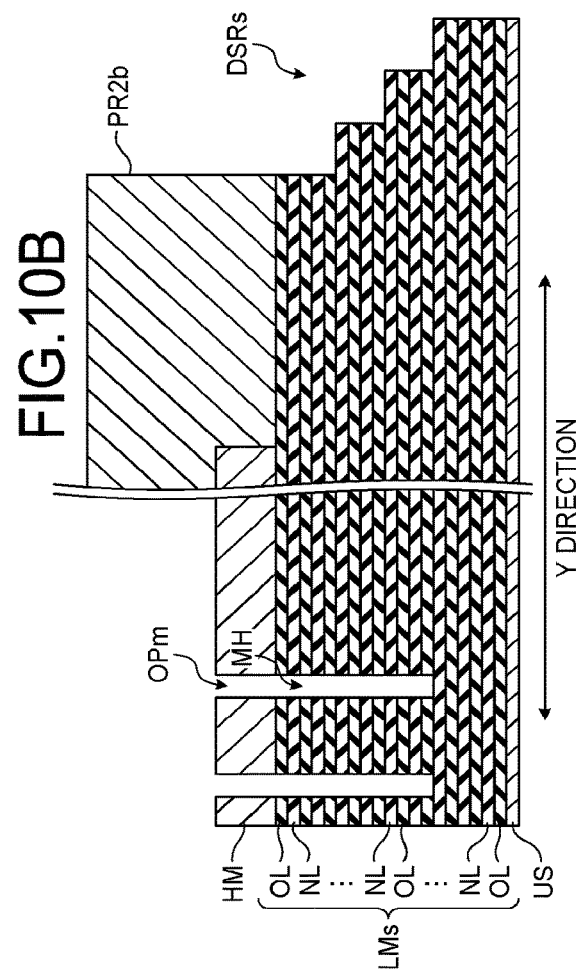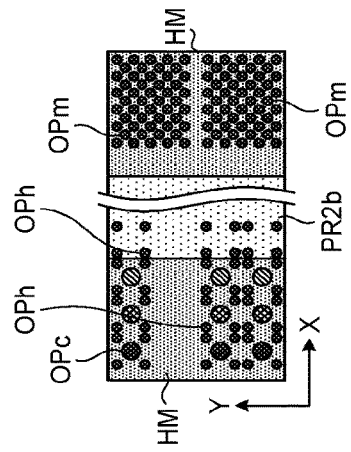

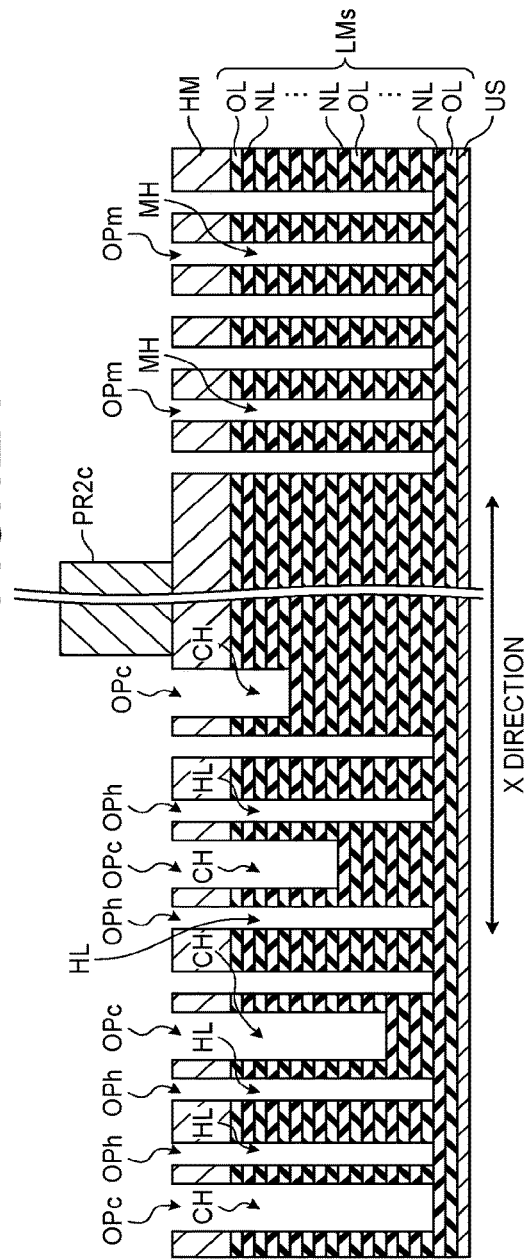
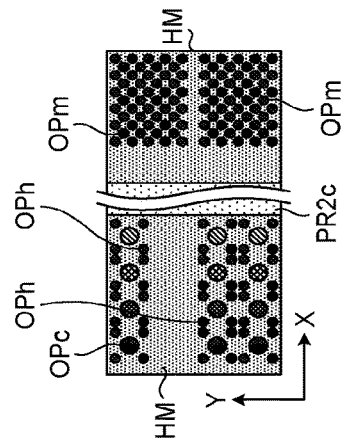
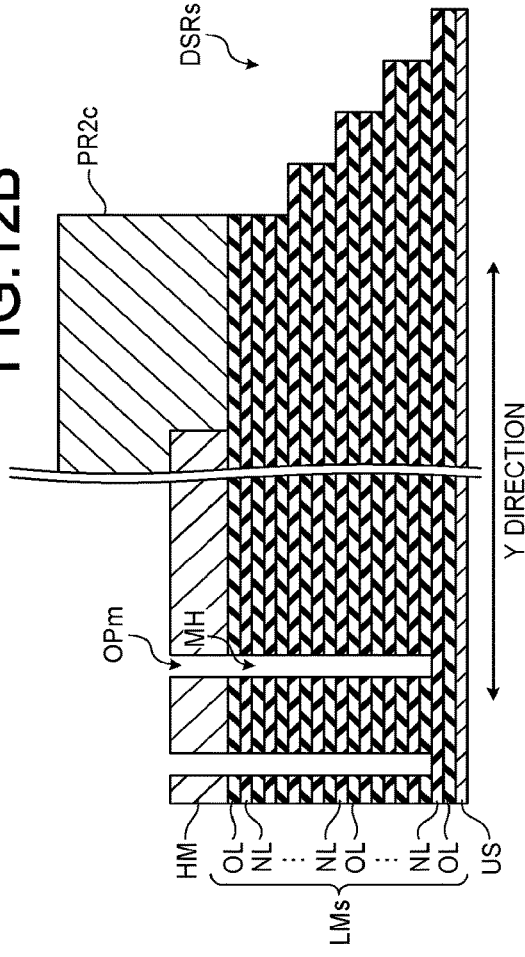

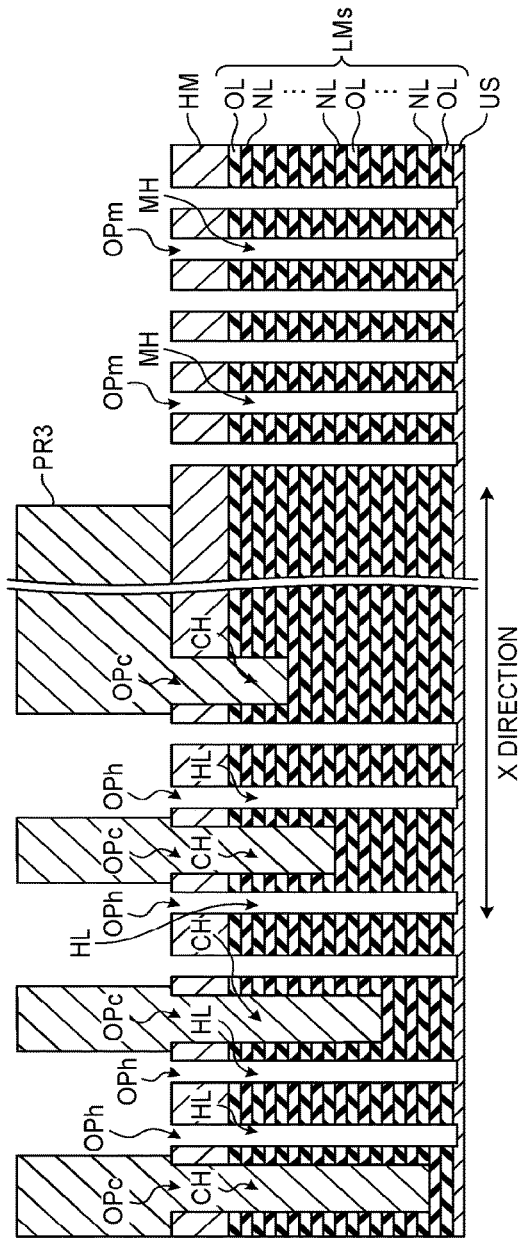
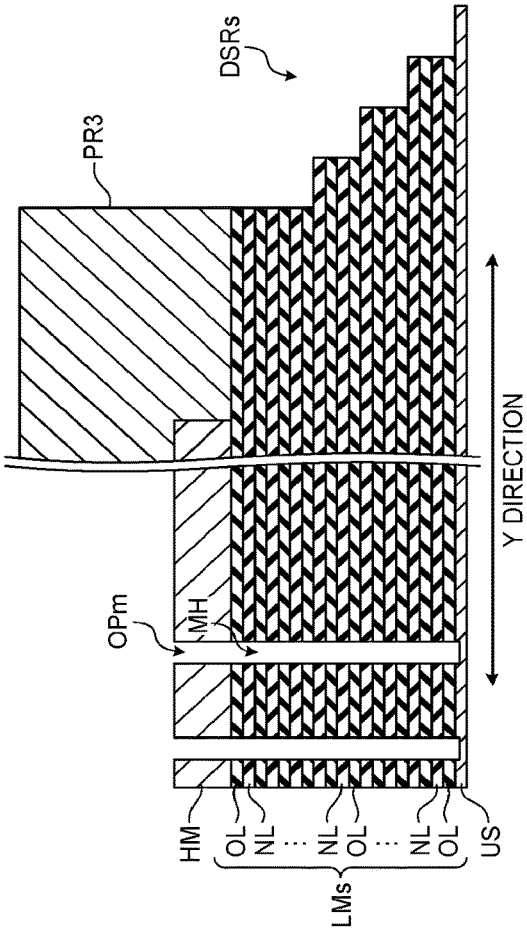

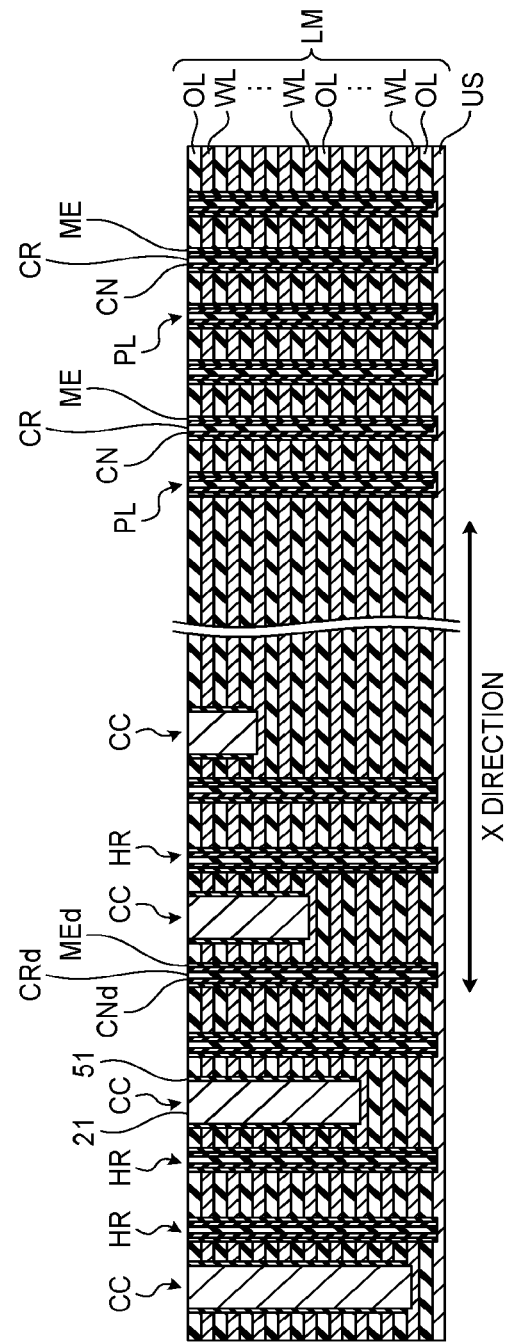

MANUFACTURING METHOD OF SEMICONDUCTOR MEMORY DEVICE AND SEMICONDUCTOR MEMORY DEVICE

CROSS-REFERENCE TO RELATED APPLICATIONS

This application is based upon and claims the benefit of priority from Japanese Patent Application No. 2020-028216, filed on Feb. 21, 2020; the entire contents of which are incorporated herein by reference.

FIELD

An embodiment described herein relates generally to a manufacturing method of a semiconductor memory device and a semiconductor memory device.

BACKGROUND

In a three-dimensional nonvolatile memory, memory cells are arranged three-dimensionally with respect to a plurality of stacked conductive layers. In each step where the plurality of conductive layers are drawn out stepwise, contacts connected to those conductive layers may be arranged. In this case, if the position of the contact is deviated from each step with the stepwise shape, the conductive layer and the contact may not be connected.

BRIEF DESCRIPTION OF THE DRAWINGS

FIGS. 3A to 3C are views illustrating an example of a procedure of a manufacturing method of the semiconductor memory device according to the embodiment;

FIGS. 5A to 5C are views illustrating an example of the procedure of the manufacturing method of the semiconductor memory device according to the embodiment;

FIGS. 6A to 6C are views illustrating an example of the procedure of the manufacturing method of the semiconductor memory device according to the embodiment;

FIGS. 7A to 7C are views illustrating an example of the procedure of the manufacturing method of the semiconductor memory device according to the embodiment;

FIGS. 8A to 8C are views illustrating an example of the procedure of the manufacturing method of the semiconductor memory device according to the embodiment;

FIGS. 10A to 10C are views illustrating an example of the procedure of the manufacturing method of the semiconductor memory device according to the embodiment;

FIGS. 12A to 12C are views illustrating an example of the procedure of the manufacturing method of the semiconductor memory device according to the embodiment;

FIGS. 13A and 13B are cross-sectional views illustrating an example of the procedure of the manufacturing method of the semiconductor memory device according to the embodiment;

FIG. 23 is a cross-sectional view illustrating an example of the procedure of the manufacturing method of the semiconductor memory device according to the embodiment.

DETAILED DESCRIPTION

A manufacturing method of a semiconductor memory device in an embodiment, includes: forming a stacked body in which a plurality of first layers are stacked while being separated from one another; forming a first mask pattern having a first opening and a plurality of second openings above the stacked body; forming a second mask pattern covering some of the plurality of second openings; and etching the stacked body with the first mask pattern as a mask while sequentially exposing the plurality of second openings by causing an end of the second mask pattern to retreat to form a first hole extending in the stacked body in a stacking direction of the stacked body at a position of the first opening and form a plurality of second holes extending in the stacked body to different depths in the stacking direction at positions of the plurality of second openings, and reaching first layers of the plurality of first layers at different levels.

The present invention will be explained below in detail with reference to the accompanying drawings. The present invention is not limited to the following embodiment. In addition, components in the following embodiment include those that can be easily conceived by a person skilled in the art or those that are substantially identical.

(Configuration Example of Semiconductor Memory Device)

Figure 1A:
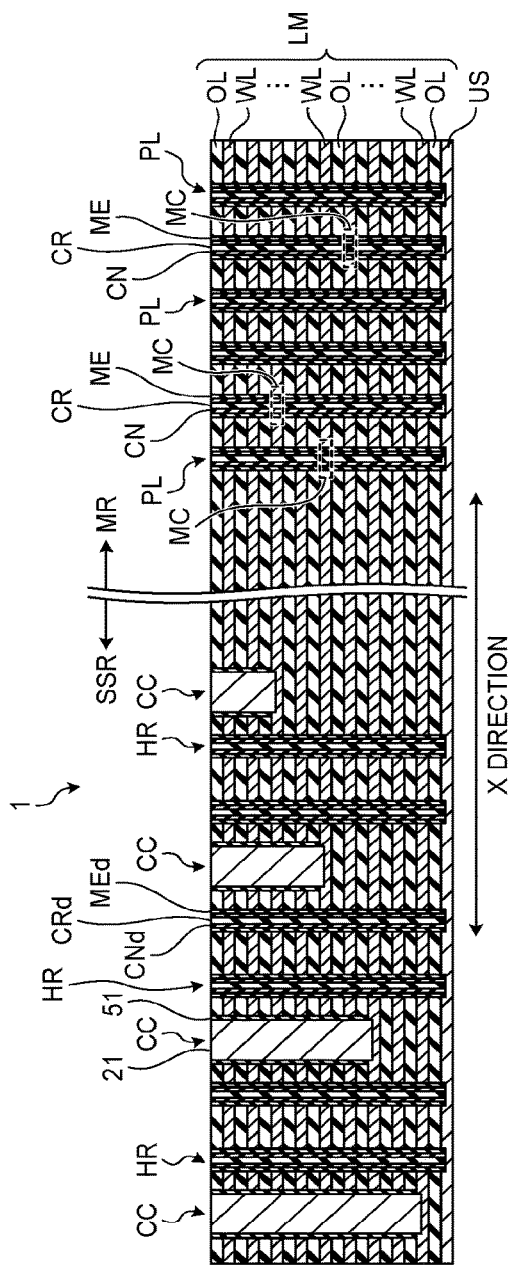
FIGS. 1A to 1C are schematic views illustrating a configuration example of a semiconductor memory device according to an embodiment.
Figure 1B:
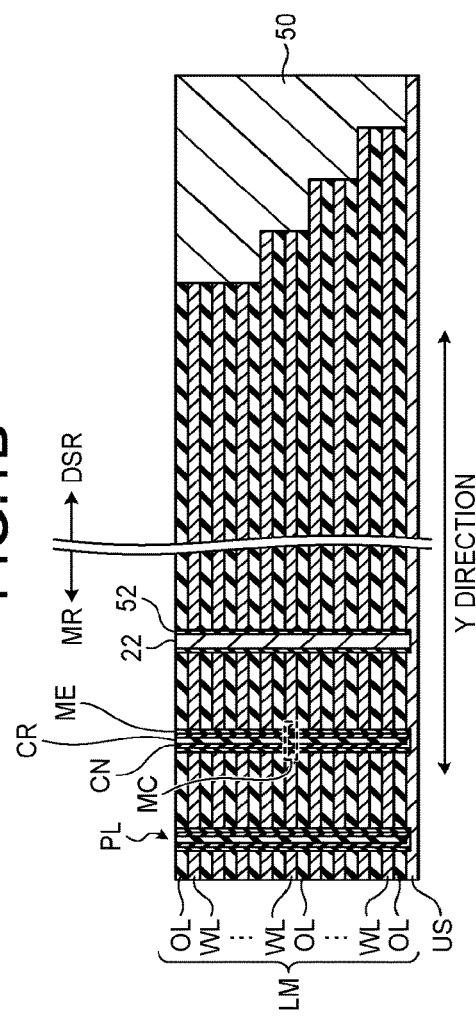
Figure 1C:
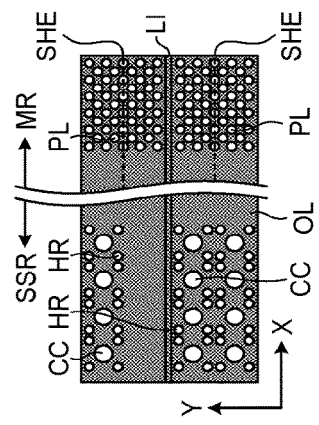

FIGS. 1A to 1C are schematic views illustrating a configuration example of a semiconductor memory device 1 according to the embodiment. FIG. 1A is a cross-sectional view of the semiconductor memory device 1 along the X direction, FIG. 1B is a cross-sectional view of the semiconductor memory device 1 along the Y direction, and FIG. 1C is a plan view of the semiconductor memory device 1. It is to be noted that in FIGS. 1A to 1C, an upper-layer wiring of a pillar PL is omitted.

As illustrated in FIGS. 1A to 1C, the semiconductor memory device 1 includes a stacked body LM in which a plurality of word lines WL as conductive layers and insulation layers OL are alternately stacked on an understructure US. The understructure US is, for example, a substrate such as a silicon substrate or a source line. The word line WL is, for example, a tungsten layer or a molybdenum layer. The insulation layer OL is, for example, a $SiO_2$ layer. The source line that is not illustrated is, for example, a polysilicon layer.

It is to be noted that in the examples of FIGS. 1A and 1B, although the stacked body LM has nine layers of word lines WL, the number of layers of the word lines WL is arbitrary. In addition, the stacked body LM may be configured by arranging a selection gate line (not illustrated) below the word line WL of the lowermost layer, or may be configured by arranging a selection gate line (not illustrated) above the word line WL of the uppermost layer.

The stacked body LM has a memory region MR in which a plurality of memory cells MC are three-dimensionally arranged near the center of the stacked body LM as a first region. The stacked body LM has a drawn-out portion SSR for individually drawing out the word lines WL at different levels near the end in the X direction of the stacked body LM as a second region. The stacked body LM has a dummy stair portion DSR near the end of the stacked body LM in the Y direction.

The stacked body LM is divided in the Y direction by a contact LI as a strip portion extending in the X direction. The contact LI zones the memory region MR and the drawn-out portion SSR into a plurality of regions called blocks.

As illustrated in FIG. 1C, in the memory region MR of the stacked body LM, an insulation member SHE indicated by a dotted line in the figure extends in a strip manner in the X direction. The insulation members SHE are alternately arranged in the Y direction with the contacts LI, and for example, the conductive layers above the word line WL of the uppermost layer are zoned into a pattern of the selection gate line (not illustrated).

As illustrated in FIG. 1B, the contact LI penetrates the stacked body LM and reaches the understructure US. The contact LI has an insulation layer 52 covering the side wall of the contact LI. A conductive layer 22 is filled inside the insulation layer 52. The insulation layer 52 is, for example, a $SiO_2$ layer. The conductive layer 22 is, for example, a polysilicon layer or a tungsten layer. The conductive layer 22 of the contact LI is connected to an upper-layer wiring that is not illustrated.

The contact LI having the conductive layer 22 connected to the upper-layer wiring is arranged on the understructure US such as a substrate or a source line, so that the contact LI functions as a source line contact, for example. However, instead of the contact LI, an insulation layer such as a $SiO_2$ layer may divide the stacked body LM in the Y direction.

In the memory region MR, a plurality of the pillars PL penetrating the stacked body LM and reaching the understructure US are arranged in a matrix.

The individual pillars PL have a memory layer ME, a channel layer CN, and a core layer CR in order from the outer peripheral side. The channel layer CN is also arranged at the bottom of the pillar PL. The memory layer ME is a layer in which, for example, a $SiO_2$ layer/a SiN layer/a $SiO_2$ layer are stacked, the channel layer CN is, for example, an amorphous silicon layer or a polysilicon layer, and the core layer CR is, for example, a $SiO_2$ layer.

The channel layer CN of the pillar PL is connected to an upper-layer wiring such as a bit line that is not illustrated. The individual pillars PL have the memory layer ME in which the SiN layer or the like as a charge accumulation layer is surrounded by an insulation layer such as a $SiO_2$ layer as a tunnel layer and a block layer, and the channel layer CN connected to a bit line or the like, whereby the plurality of memory cells MC are formed at respective intersections between the pillars PL and the word lines WL.

In addition, the insulation member SHE described above is formed, for example, above the center pillars PL of the pillars PL between the contacts LI arranged in the Y direction so as to intersect the center pillars PL. Due to this, the insulation member SHE divides the conductive layer (not illustrated) arranged further above the word line WL of the uppermost layer of the stacked body LM, between the two contacts LI, into two selection gate lines adjacent to each other in the Y direction.

As described above, the plurality of memory cells MC are three-dimensionally arranged in the memory region MR. That is, the semiconductor memory device 1 is configured as a three-dimensional nonvolatile memory, for example.

The dummy stair portion DSR is adjacent to the memory region MR in the Y direction and has a stepwise structure ascending stepwise toward the memory region MR. Each step of the dummy stair portion DSR is covered with an insulation layer 50 so as to have a height substantially equal to the height of the upper surface of the stacked body LM in the memory region MR. In this description, the direction in which the terrace surface of each step of the dummy stair portion DSR faces is defined as the upward direction.

As illustrated in FIG. 1A, in the drawn-out portion SSR, a plurality of columnar portions HR penetrating the stacked body LM and reaching the understructure US is arranged in a matrix.

The individual columnar portions HR have a size substantially equal to, for example, the pillar PL, and the individual columnar portions HR are filled with a material similar to, for example, the pillar PL. That is, the columnar portion HR has dummy layers MEd, CNd, and CRd in order from the outer peripheral side. The dummy layer MEd is a layer in which, for example, a $SiO_2$ layer/a SiN layer/a $SiO_2$ layer are stacked, the dummy layer CNd is, for example, an amorphous silicon layer or a polysilicon layer, and the dummy layer CRd is, for example, a $SiO_2$ layer.

The columnar portions HR support a stacked structure included in the semiconductor memory device 1 in the middle of manufacturing in the manufacturing process of the semiconductor memory device 1 described later.

A plurality of contacts CC are also arranged in the drawn-out portion SSR. The individual contacts CC have an insulation layer 51 covering the outer periphery of the contact CC. A conductive layer 21 is filled inside the insulation layer 51. The insulation layer 51 is, for example, a $SiO_2$ layer. The conductive layer 21 is, for example, a tungsten layer.

The plurality of contacts CC extend in the stacking direction to different depths in the stacked body LM and reach the word lines WL at different levels. More specifically, the farther the plurality of contacts CC are away from the memory region MR, for example, the lower word line WL the plurality of contacts CC reach, and the plurality of contacts CC are electrically connected with those word lines WL.

In the cross section illustrated in FIG. 1A, the four contacts CC arranged toward the memory region MR are connected to the word line WL of the lowermost layer, the third word line WL from the lowermost layer, the fifth word line WL from the lowermost layer, and the seventh word line WL from the lowermost layer, respectively.

Figure 2:
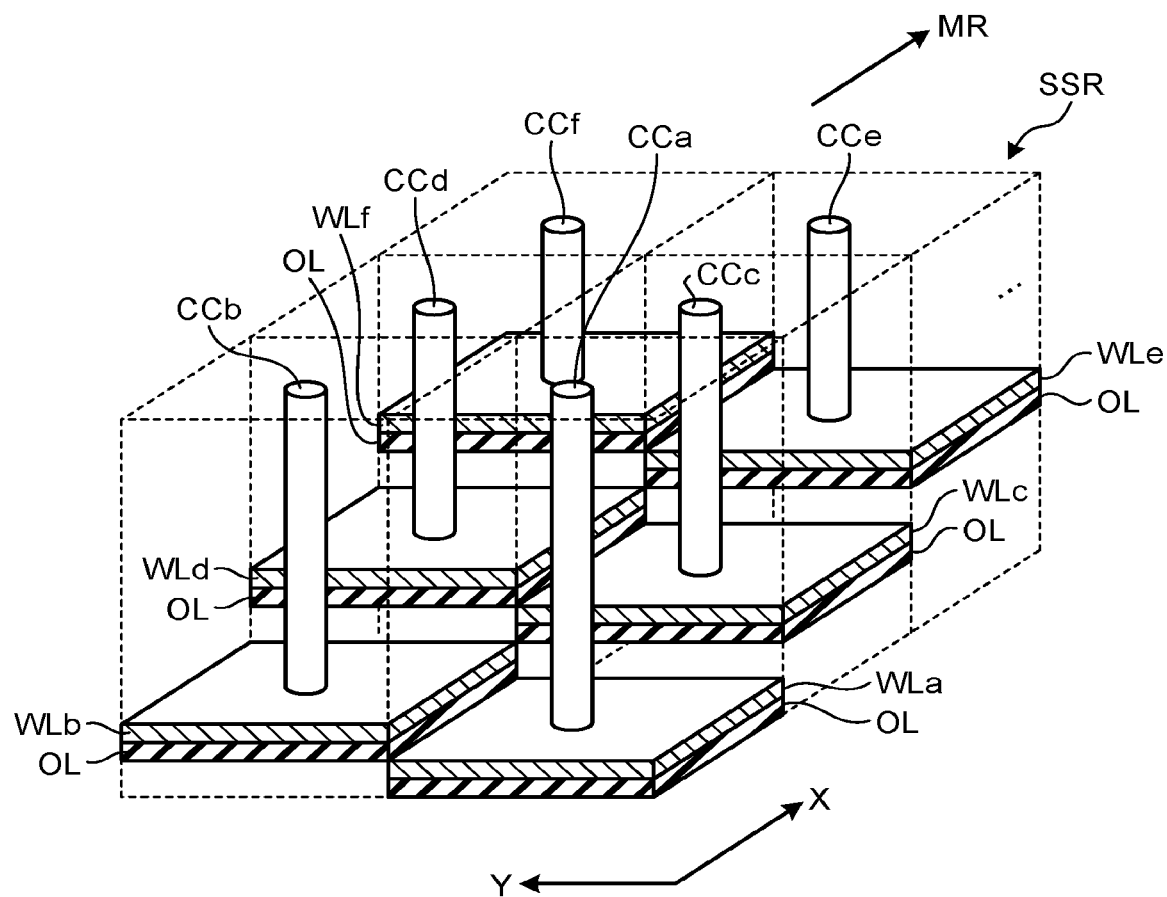
FIG. 2 is a perspective view illustrating a configuration example of a drawn-out portion of the semiconductor memory device according to the embodiment.

FIG. 2 is a perspective view illustrating the configuration example of the drawn-out portion SSR of the semiconductor memory device 1 according to the embodiment.

As illustrated in FIG. 2, the drawn-out portion SSR has two lines of the contacts CC toward the memory region MR, for example. As described above, the closer to the memory region MR the contact CC gets, the more upper word line WL the contact CC is connected to. In addition, the contact CC belonging to one of the two lines of the contacts CC is connected with the word line WL higher by one layer than the contact CC belonging to the other line and having the equal distance from the memory region MR.

In the example illustrated in FIG. 2, contacts CCb, CCd, and CCf belonging to one line are connected to the second word line WLb from the lowermost layer, the fourth word line WLd from the lowermost layer, and the sixth word line WLf from the lowermost layer, respectively. In addition, contacts CCa, CCc, and CCe belonging to the other line are connected to the word line WLa of the lowermost layer, the third word line WLc from the lowermost layer, and the fifth word line WLe from the lowermost layer, respectively.

In this manner, the word lines WL at all the levels are connected to the respective contacts CC. Then, the contact CC is connected with an upper-layer wiring that is not illustrated.

The contacts CC connected to the upper-layer wiring are connected to the word lines WL at different levels, whereby the word lines WL connected to the memory cells MC arranged in the height direction can be electrically drawn out.

It is to be noted that although not illustrated in FIG. 1, the semiconductor memory device 1 includes a peripheral circuit including a transistor arranged on a substrate, for example. The peripheral circuit contributes to the operation of the memory cell MC.

(Manufacturing Method of Semiconductor Memory Device)

Next, examples of a manufacturing method of the semiconductor memory device 1 of the embodiment will be described with reference to FIGS. 3A to 24B.

Figure 24A:
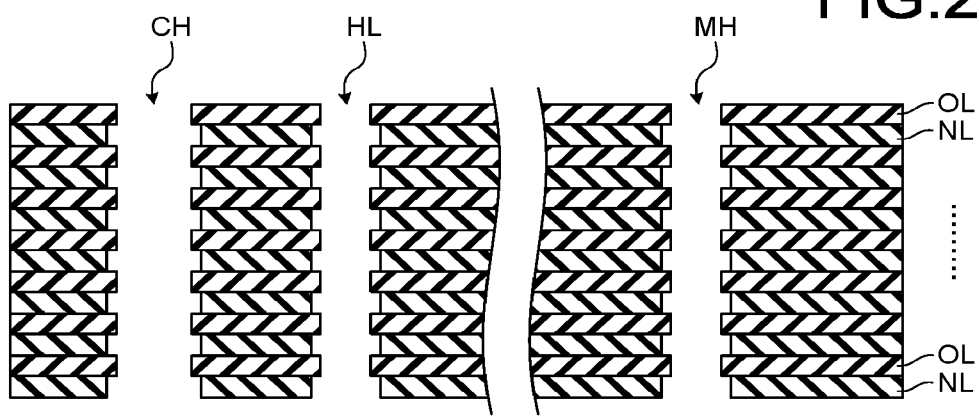
FIGS. 24A and 24B are cross-sectional views illustrating an example of the procedure of the manufacturing method of the semiconductor memory device according to the embodiment.
Figure 24B:
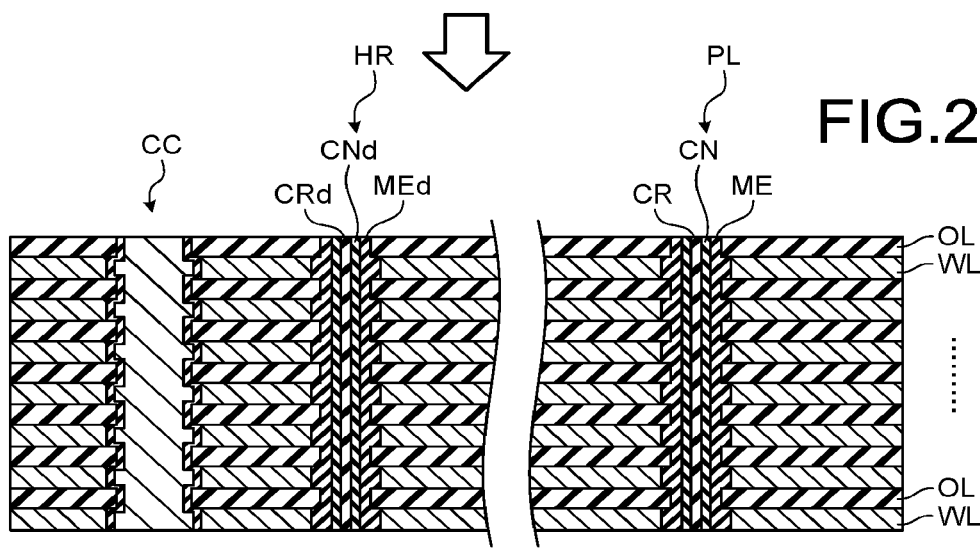

FIGS. 3A to 24B are views illustrating examples of the procedure of the manufacturing method of the semiconductor memory device 1 according to the embodiment. A to C in the identical figure number of FIGS. 3A to 12C illustrate different cross sections or planes in the middle of the same processing step. In FIGS. 3A to 12C, A corresponds to the site of FIG. 1A, B corresponds to the site of FIG. 1B, and C corresponds to the site of FIG. 1C. A and B in the identical figure number of FIGS. 13A to 18B illustrate different cross sections in the middle of the same processing step. In FIGS. 13A to 18B, A corresponds to the site of FIGS. 1A and B corresponds to the site of FIG. 1B. FIGS. 19 to 23 are cross-sectional views corresponding to the site of FIG. 1A, and FIGS. 24A and 24B are enlarged cross-sectional views corresponding to the site of FIG. 1A.

As illustrated in FIGS. 3A and 3B, a stacked body LMs is formed, the stacked body LMs in which a plurality of sacrificial layers NL as first layers are stacked while being separated from one another above the understructure US such as a substrate or a source line. More specifically, the stacked body LMs in which the plurality of sacrificial layers NL and insulation layers OL are alternately stacked is formed. The sacrificial layer NL is an insulation layer such as, for example, a SiN layer, and is later replaced with a conductive material to become the word line WL.

A hard mask HMbk is formed on the stacked body LMs. The hard mask HMbk is a layer including an inorganic material which is not removed by $O_2$ plasma or the like. More specifically, a layer of a silicon-based material such as an amorphous silicon layer or a polysilicon layer can be used as the hard mask HMbk. It is to be noted that the hard mask HMbk is not formed in a region that will later become the dummy stair portion DSR.

A mask pattern PR1 on which a pattern is formed on, for example, a photoresist layer is formed on the hard mask HMbk. The mask pattern PR1 is formed also on the stacked body LMs in a region that will later become the dummy stair portion DSR.

The mask pattern PR1 has a plurality of openings having the same size as that of the pillar PL at a position corresponding to the pillar PL in a region that will later become the memory region MR. In addition, the mask pattern PR1 has a plurality of openings having the same size as that of the contact CC at a position corresponding to the contact CC in a region that will later become the drawn-out portion SSR. In addition, the mask pattern PR1 has a plurality of openings having the same size as that of the columnar portion HR at a position corresponding to the columnar portion HR in a region that will later become the drawn-out portion SSR.

It is to be noted that although not illustrated in FIGS. 3A to 3C, the insulation member SHE may already be formed in the stacked body LMs at this stage. The insulation member SHE is formed by filling an insulator in a groove formed so as to penetrate (a sacrificial layer and an insulation layer of the further upper layer of) the stacked body LMs halfway, for example.

Figure 4A:
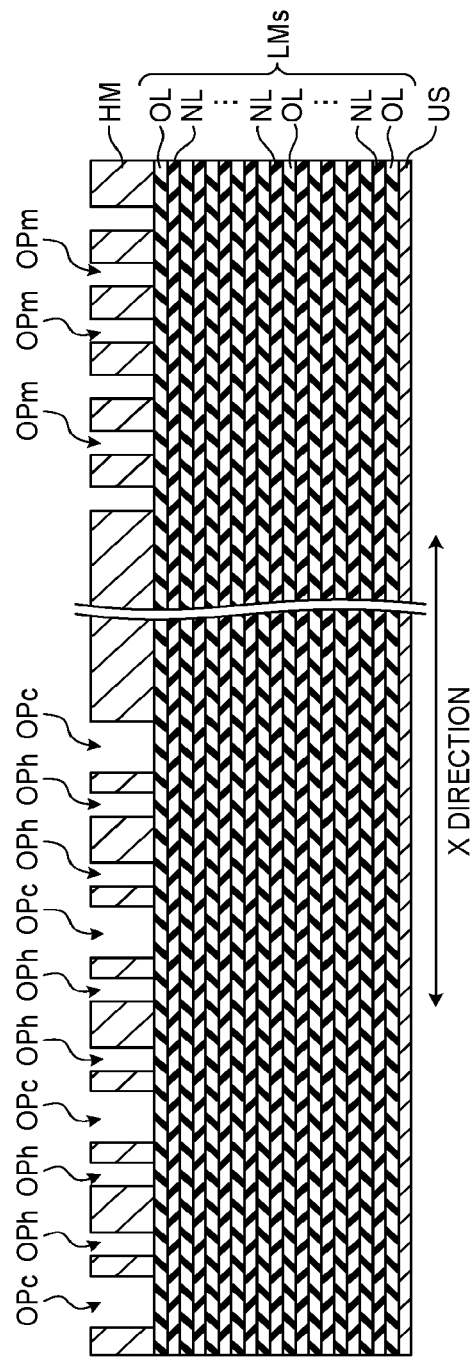
FIGS. 4A to 4C are views illustrating an example of the procedure of the manufacturing method of the semiconductor memory device according to the embodiment.
Figure 4B:
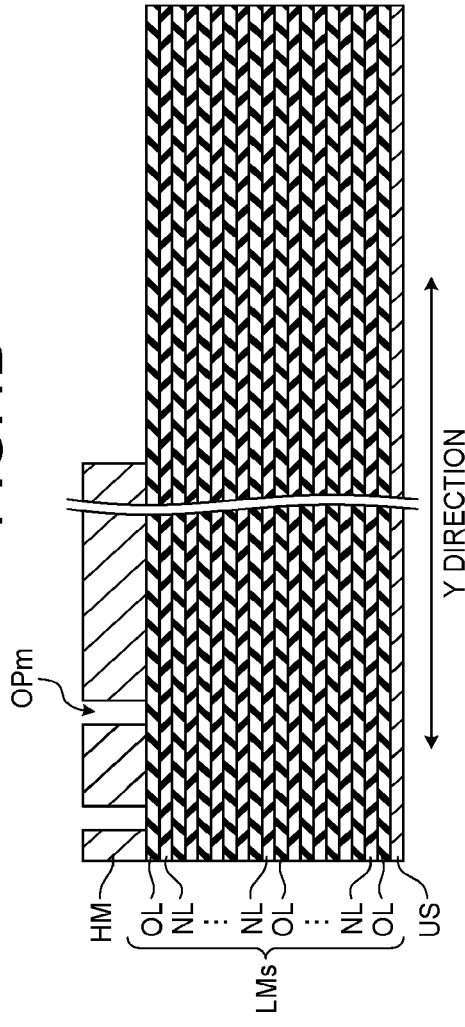
Figure 4C:
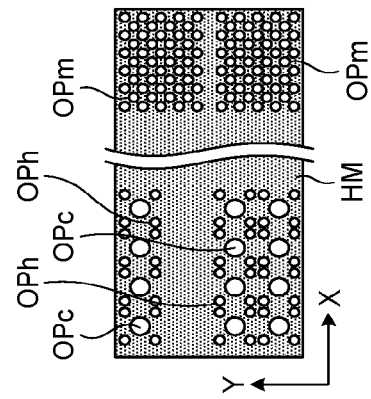

As illustrated in FIGS. 4A and 4B, the hard mask HMbk is etched with the mask pattern PR1 as a mask to form a mask pattern HM on which the mask pattern PR1 has been transferred. Thereafter, the mask pattern PR1 is peeled off by $O_2$ plasma asking or the like.

The mask pattern HM as a first mask pattern has a plurality of openings OPm having the same size as that of the pillar PL at a position corresponding to the pillar PL in a region that will later become the memory region MR. In addition, the mask pattern HM has a plurality of openings OPc having the same size as that of the contact CC at a position corresponding to the contact CC in a region that will later become the drawn-out portion SSR. In addition, the mask pattern HM has a plurality of openings OPh having the same size as that of the columnar portion HR at a position corresponding to the columnar portion HR in a region that will later become the drawn-out portion SSR.

As illustrated in FIGS. 5A to 5C, a mask pattern PR2 on which a pattern is formed on, for example, a photoresist layer is formed on the mask pattern HM or the like. For the mask pattern PR2, an organic material such as a photoresist layer for which slimming treatment with $O_2$ plasma or the like can be applied is used. The mask pattern PR2 as the second mask pattern covers a part of the mask pattern HM, and is formed also on the stacked body LMs in a region that will later become the dummy stair portion DSR.

In the mask pattern HM, all of the openings OPm are exposed in a region that will later become the memory region MR. In the mask pattern HM, all of the openings OPh are exposed in a region that will later become the drawn-out portion SSR. However, only the opening OPc of the plurality of openings OPc farthermost from the region that will later become the memory region MR is exposed from the mask pattern HM.

As illustrated in FIGS. 6A and 6B, the stacked body LMs is etched to a predetermined depth with the mask patterns PR2 and HM as a mask. That is, the stacked body LMs in the portion where both mask patterns PR2 and HM are open is etched.

Due to this, a plurality of memory holes MH reaching, for example, the seventh sacrificial layer NL from the lowermost layer are formed in a region that will later become the memory region MR. A plurality of holes HL reaching, for example, the seventh sacrificial layer NL from the lowermost layer are formed in a region that will later become the drawn-out portion SSR. A contact hole CH reaching, for example, the seventh sacrificial layer NL from the lowermost layer is formed at a position farthermost from a region that will later become the memory region MR. A stair portion DSRs having one step dug down to the seventh sacrificial layer NL from the lowermost layer is formed in a region that will later become the dummy stair portion DSR.

As illustrated in FIGS. 7A to 7C, the mask pattern PR2 is slimmed by treatment with O₂ plasma or the like. Due to this, the thickness of the mask pattern PR2 is reduced, and each end of the mask pattern PR2 retreats. That is, slimming results in forming a mask pattern PR2a in which the end of the region side that will later become the memory region MR retreats toward the region side that will later become the drawn-out portion SSR, the end of the region that will later become the drawn-out portion SSR retreats toward the region that will later become the memory region MR, and the end of the region that will later become the dummy stair portion DSR retreats toward the region that will later become the memory region MR.

As a result, the opening OPc of the plurality of openings OPc of the mask pattern HM positioned at the second farthermost from the region that will later become the memory region MR is newly exposed in the region that will later become the drawn-out portion SSR. In the region that will later become the dummy stair portion DSR, the upper surface of the stacked body LMs is newly exposed.

As illustrated in FIGS. 8A and 8B, the stacked body LMs is etched to a predetermined depth with the mask patterns PR2a and HM as a mask. Thus, in the newly exposed opening OPc, a contact hole CH reaching, for example, the seventh sacrificial layer NL from the lowermost layer is formed.

On the other hand, the plurality of memory holes MH and the plurality of holes HL, which have already reached the predetermined depth, and the contact hole CH, which is positioned farthermost from the region that will later become the memory region MR, are provided with additional etching and reach, for example, the fifth sacrificial layer NL from the lowermost layer.

In addition, in the region that will later become the dummy stair portion DSR, the stair portion DSRs is formed, in which a step having reached the predetermined depth becomes a step dug down to, for example, the fifth sacrificial layer NL from the lowermost layer, and the newly exposed upper surface of the stacked body LMs becomes a step dug down to, for example, the seventh sacrificial layer NL from the lowermost layer.

Figure 9A:
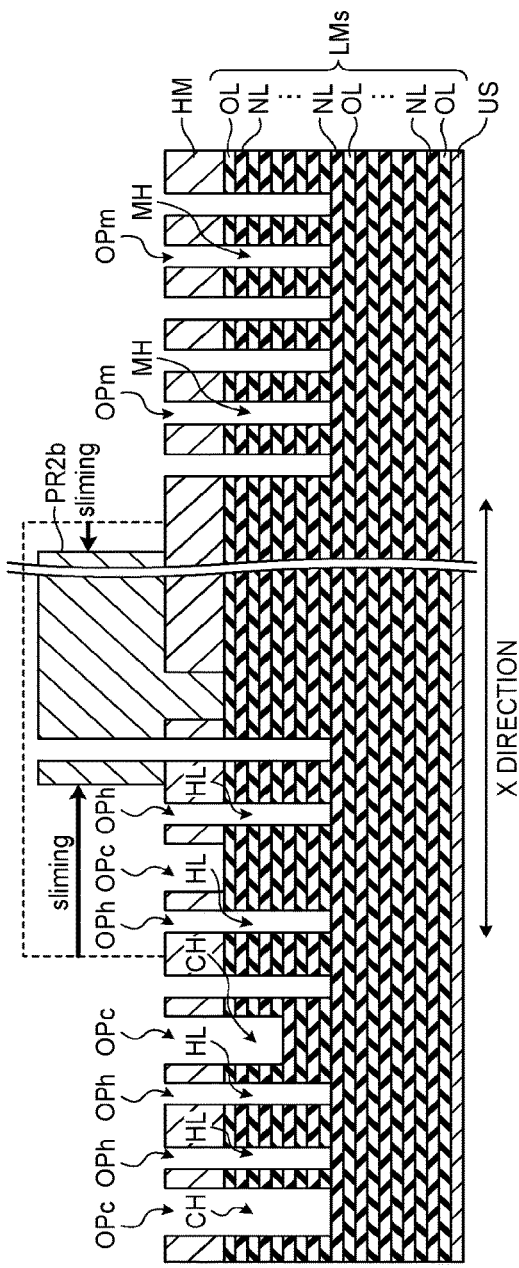
FIGS. 9A to 9C are views illustrating an example of the procedure of the manufacturing method of the semiconductor memory device according to the embodiment.
Figure 9B:
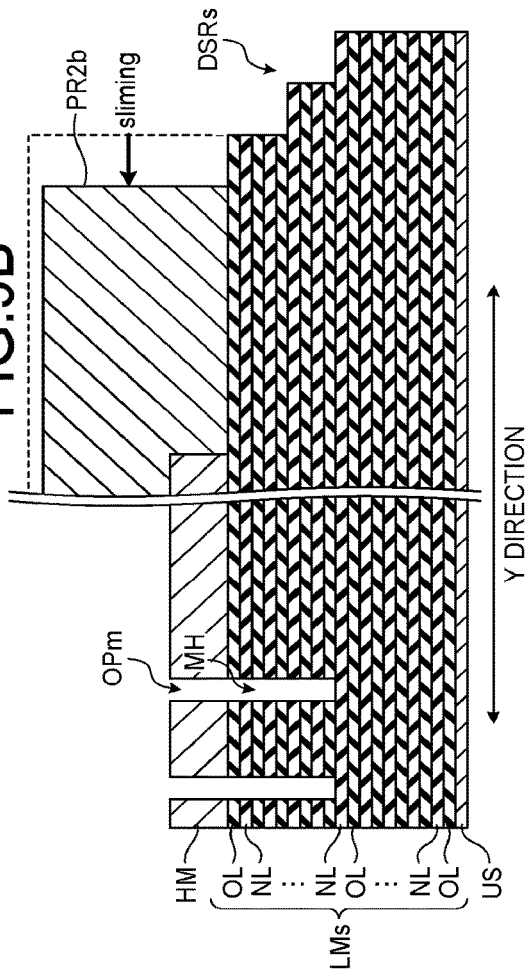
Figure 9C:
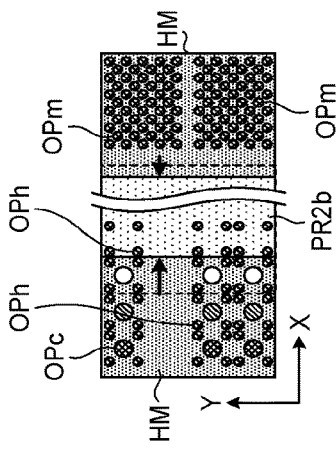

As illustrated in FIGS. 9A to 9C, the mask pattern PR2a is slimmed by treatment with O₂ plasma or the like. By this slimming, the thickness of the mask pattern PR2a is reduced, and a mask pattern PR2b in which each end has retreated is formed.

As a result, the opening OPc of the plurality of openings OPc of the mask pattern HM at the third farthermost position from the region that will later become the memory region MR is newly exposed in the region that will later become the drawn-out portion SSR. In the region that will later become the dummy stair portion DSR, the upper surface of the stacked body LMs is newly exposed.

As illustrated in FIGS. 10A and 10B, the stacked body LMs is etched to a predetermined depth with the mask patterns PR2b and HM as a mask. Thus, in the newly exposed opening OPc, a contact hole CH reaching, for example, the seventh sacrificial layer NL from the lowermost layer is formed.

On the other hand, the plurality of memory holes MH and the plurality of holes HL, which have already reached the predetermined depth, and the contact hole CH, which is positioned farthermost from the region that will later become the memory region MR, are provided with additional etching and reach, for example, the third sacrificial layer NL from the lowermost layer. In addition, the contact hole CH positioned at the second farthermost from the region that will later become the memory region MR is provided with additional etching and reaches, for example, the fifth sacrificial layer NL from the lowermost layer.

In addition, in the region that will later become the dummy stair portion DSR, the stair portion DSRs is formed, in which steps having reached the predetermined depths become steps dug down to, for example, the third and fifth sacrificial layers NL from the lowermost layer, respectively, and the newly exposed upper surface of the stacked body LMs becomes a step dug down to, for example, the seventh sacrificial layer NL from the lowermost layer.

Figure 11C:
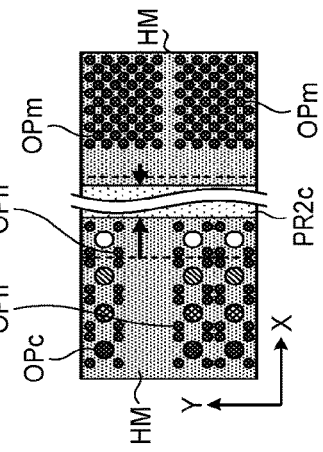
FIGS. 11A to 11C are views illustrating an example of the procedure of the manufacturing method of the semiconductor memory device according to the embodiment.
Figure 11A:
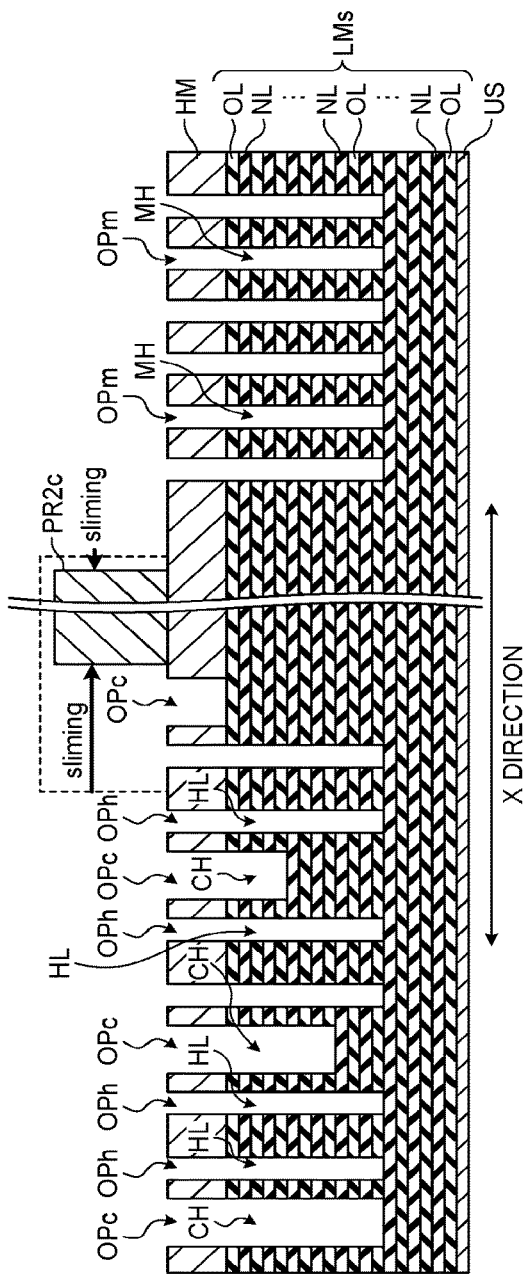
Figure 11B:
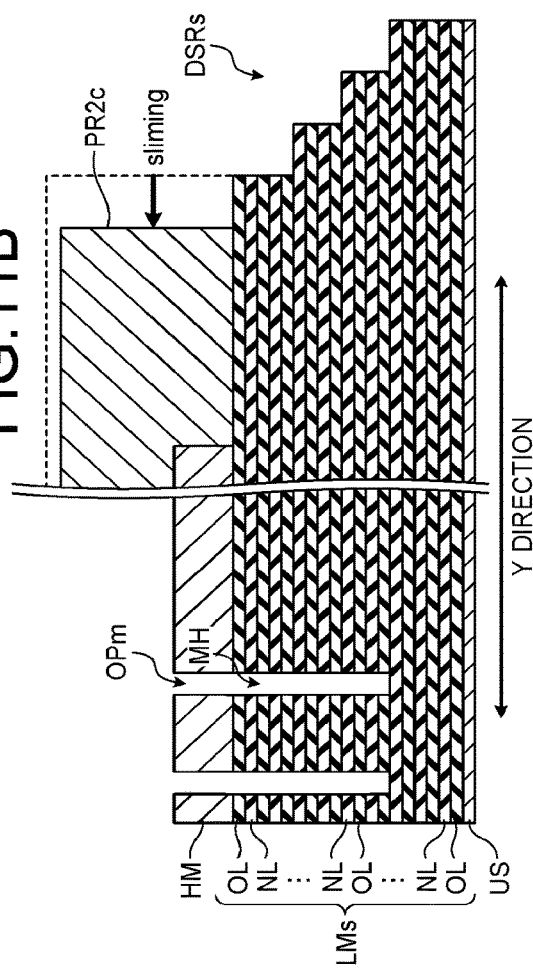

As illustrated in FIGS. 11A to 11C, the mask pattern PR2b is slimmed by treatment with O₂ plasma or the like. By this slimming, the thickness of the mask pattern PR2b is reduced, and a mask pattern PR2c in which each end has retreated is formed.

As a result, the opening OPc of the plurality of openings OPc of the mask pattern HM at the nearest position from the region that will later become the memory region MR is newly exposed in the region that will later become the drawn-out portion SSR. In the region that will later become the dummy stair portion DSR, the upper surface of the stacked body LMs is newly exposed.

As illustrated in FIGS. 12A and 12B, the stacked body LMs is etched to a predetermined depth with the mask patterns PR2c and HM as a mask. Thus, in the newly exposed opening OPc, a contact hole CH reaching, for example, the seventh sacrificial layer NL from the lowermost layer is formed.

On the other hand, the plurality of memory holes MH and the plurality of holes HL, which have already reached the predetermined depth, and the contact hole CH, which is positioned farthermost from the region that will later become the memory region MR, are provided with additional etching and reach, for example, the sacrificial layer NL of the lowermost layer. In addition, the contact holes CH positioned at the second and third farthermost from the region that will later become the memory region MR are provided with additional etching and reach, for example, the third and fifth sacrificial layers NL from the lowermost layer, respectively.

In addition, in the region that will later become the dummy stair portion DSR, the stair portion DSRs is formed, in which steps having reached the predetermined depths become steps dug down to, for example, the lowermost layer and the third and fifth sacrificial layers NL from the lowermost layer, respectively, and the newly exposed upper surface of the stacked body LMs becomes a step dug down to, for example, the seventh sacrificial layer NL from the lowermost layer.

When etching is performed while causing the mask patterns PR2 and PR2a to PR2c to retreat, the total number of sacrificial layers NL to be removed by etching is controlled to be equal every time, for example. In this case, if the number of layers to be removed by one etching is m layers (m is an integer equal to or greater than 1), after the processing of FIGS. 12A and 12B is completed, the contact holes CH penetrating the 4m layers, the 3m layers, the 2m layers, and the m layers are formed in order from the side far from the memory region MR.

This also applies to the stair portion DSRs, which is secondarily formed in association with the retreat of the ends of the mask patterns PR2 and PR2a to PR2c. That is, after the processing of FIGS. 12A and 12B is completed, the stair portion DSRs having steps dug down by the 4m layers, the 3m layers, the 2m layers, and the m layers in order from the side far from the memory region MR is formed. Thus, the stair portion DSRs has a relatively gentle and regular step difference. That is, each step of the stair portion DSRs is composed of the sacrificial layers NL and the insulation layers OL having substantially equal number of layers, and the terrace surfaces of the respective steps, i.e., the widths of the flat portions in the Y direction are substantially equal.

Thereafter, the mask pattern PR2c is peeled off by $O_2$ plasma ashing or the like.

As illustrated in FIGS. 13A and 13B, a mask pattern PR3 on which a pattern is formed on, for example, a photoresist layer is formed on the stacked body LMs from above the mask pattern HM. The mask pattern PR3 covers all the contact holes CH in the region that will later become the drawn-out portion SSR, the upper surface of the stacked body LMs exposed in the region that will later become the dummy stair portion DSR, and the like.

In this way, in a state where all the contact holes CH are protected, the bottoms of the memory hole MH and the hole HL are additionally etched to form the memory hole MH and the hole HL reaching the understructure US. In the region that will later become the dummy stair portion DSR, the stair portion DSRs is formed, in which each step is dug down by the pair of the sacrificial layer NL and the insulation layer OL, and the lowermost step reaches the understructure US.

Figure 14A:
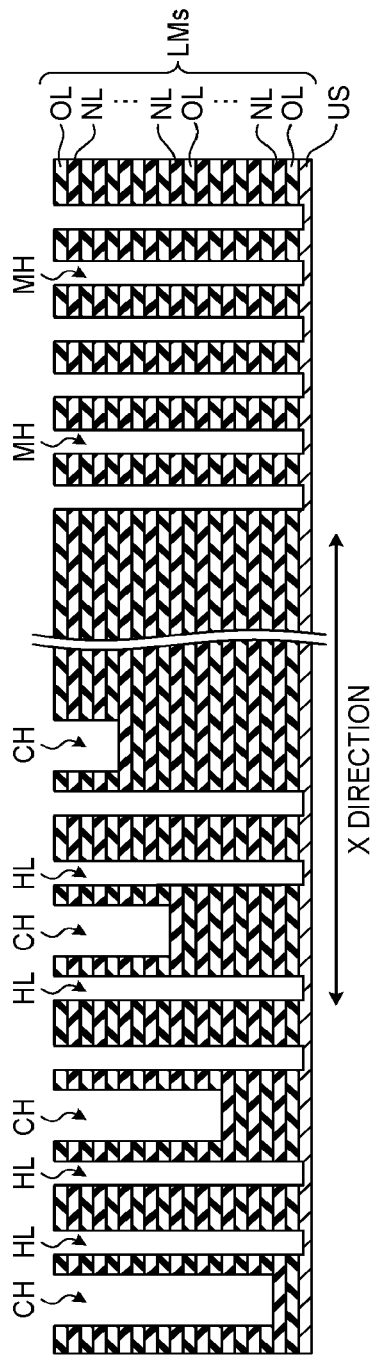
FIGS. 14A and 14B are cross-sectional views illustrating an example of the procedure of the manufacturing method of the semiconductor memory device according to the embodiment.
Figure 14B:
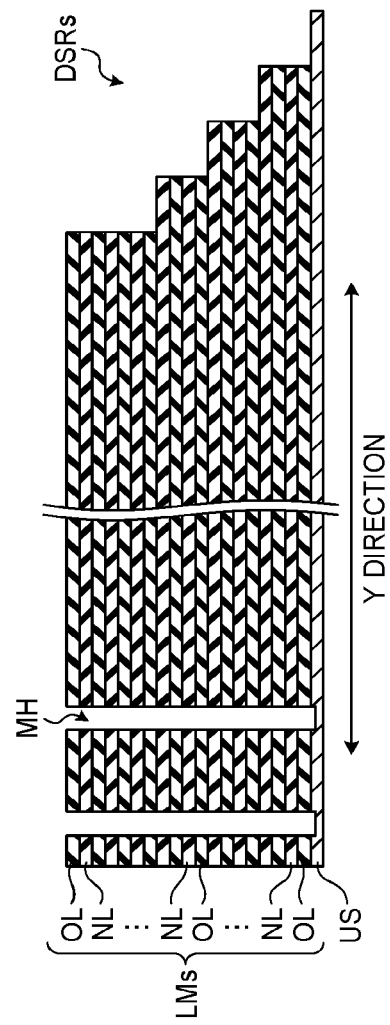

As illustrated in FIGS. 14A and 14B, the mask pattern PR3 is peeled off by $O_2$ plasma ashing or the like, and the mask pattern HM is removed by etching or the like.

Figure 15A:
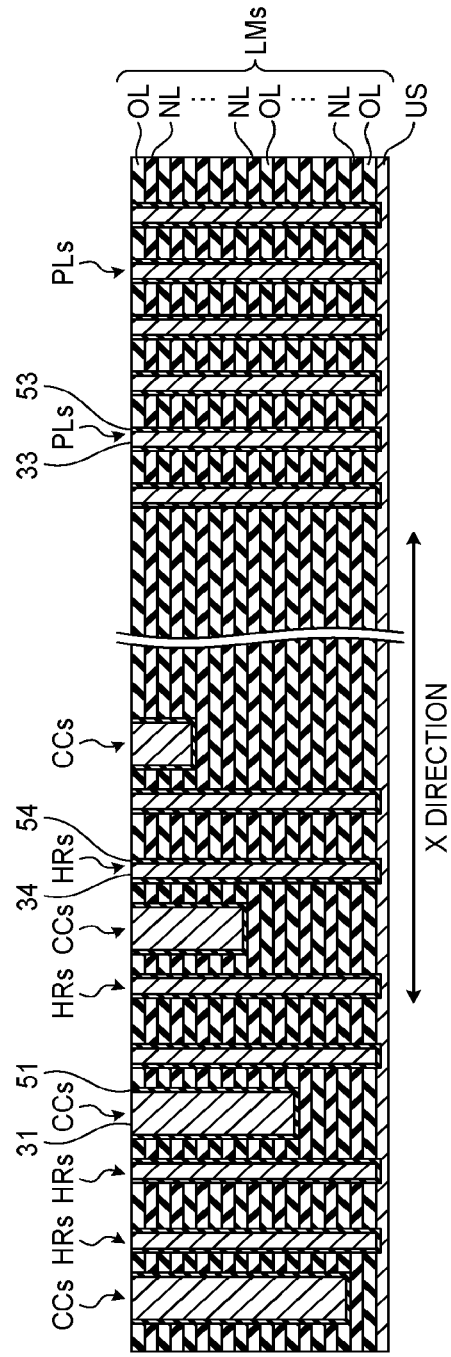
FIGS. 15A and 15B are cross-sectional views illustrating an example of the procedure of the manufacturing method of the semiconductor memory device according to the embodiment.
Figure 15B:
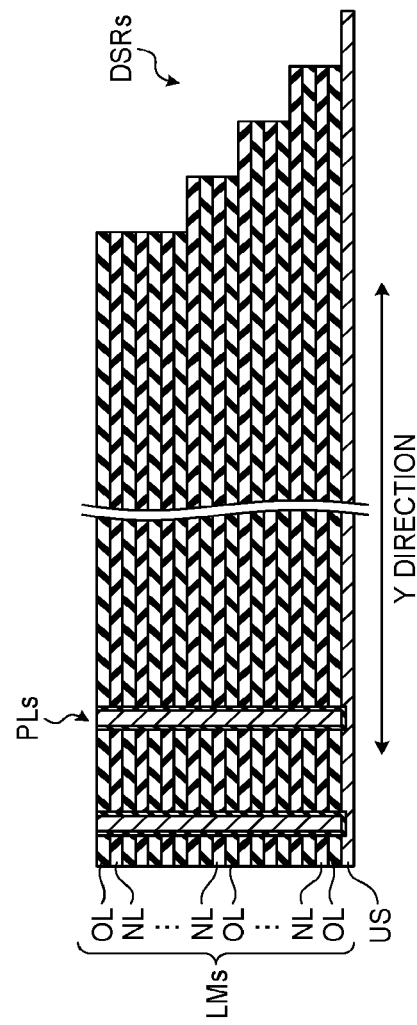

As illustrated in FIGS. 15A and 15B, the inner wall of the memory hole MH is covered with an insulation layer 53, and a sacrificial layer 33 such as an amorphous silicon layer is filled further inside the insulation layer 53, whereby a pillar PLs is formed. The inner wall of the contact hole CH is covered with the insulation layer 51, and a sacrificial layer 31 such as an amorphous silicon layer is filled further inside the insulation layer 51, whereby a contact CCs is formed. The inner wall of the hole HL is covered with an insulation layer 54, and a sacrificial layer 34 such as an amorphous silicon layer is filled further inside the insulation layer 54, whereby a columnar portion HRs is formed.

Figure 16A:
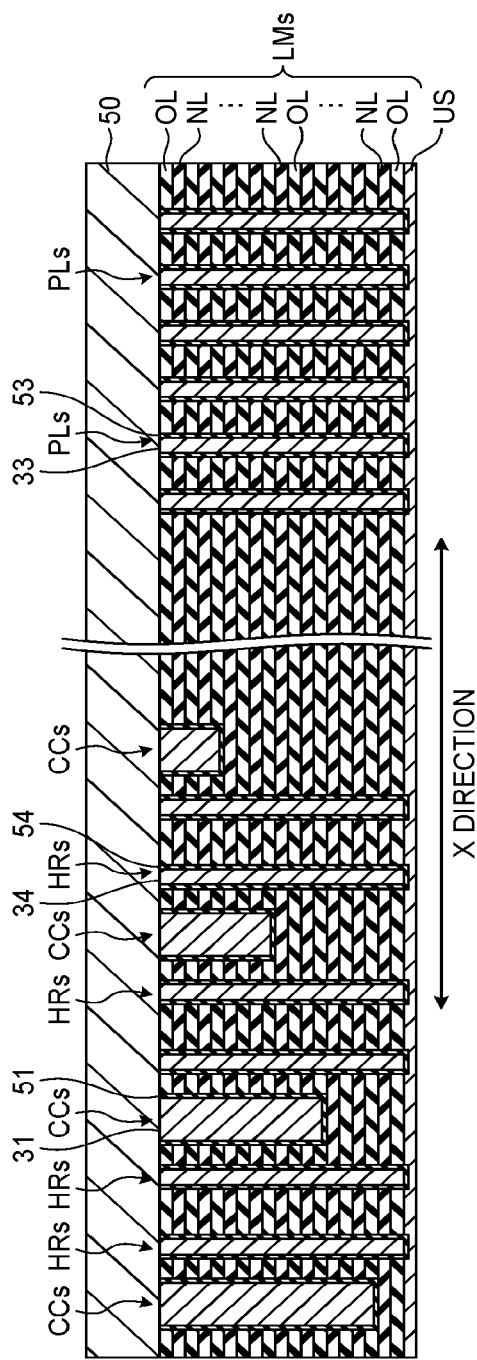
FIGS. 16A and 16B are cross-sectional views illustrating an example of the procedure of the manufacturing method of the semiconductor memory device according to the embodiment.
Figure 16B:
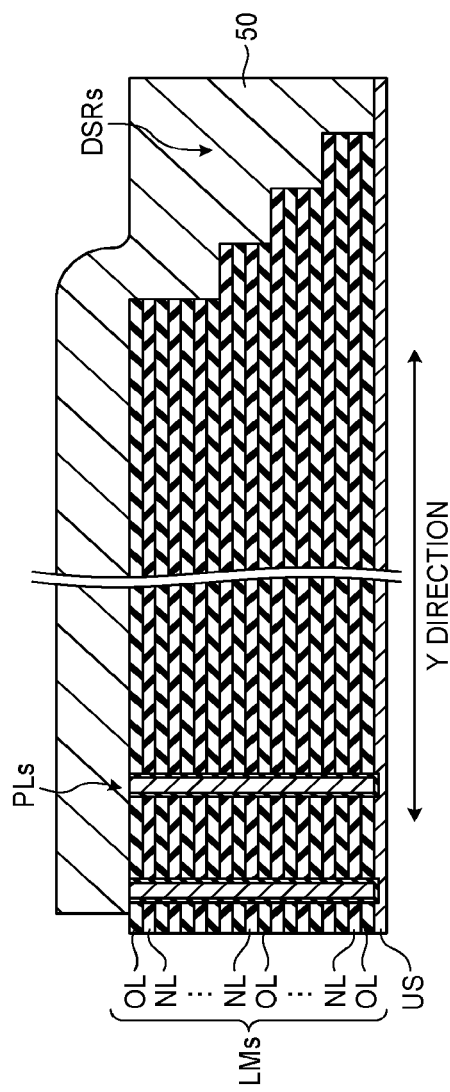

As illustrated in FIGS. 16A and 16B, the step difference of the stair portion DSRs is backfilled with the insulation layer 50 such as a $SiO_2$ layer. As described above, the stair portion DSRs has a relatively gentle and regular step difference. This suppresses unevenness from occurring on the upper surface of the insulation layer 50 when the step difference of each step is backfilled.

Figure 17A:
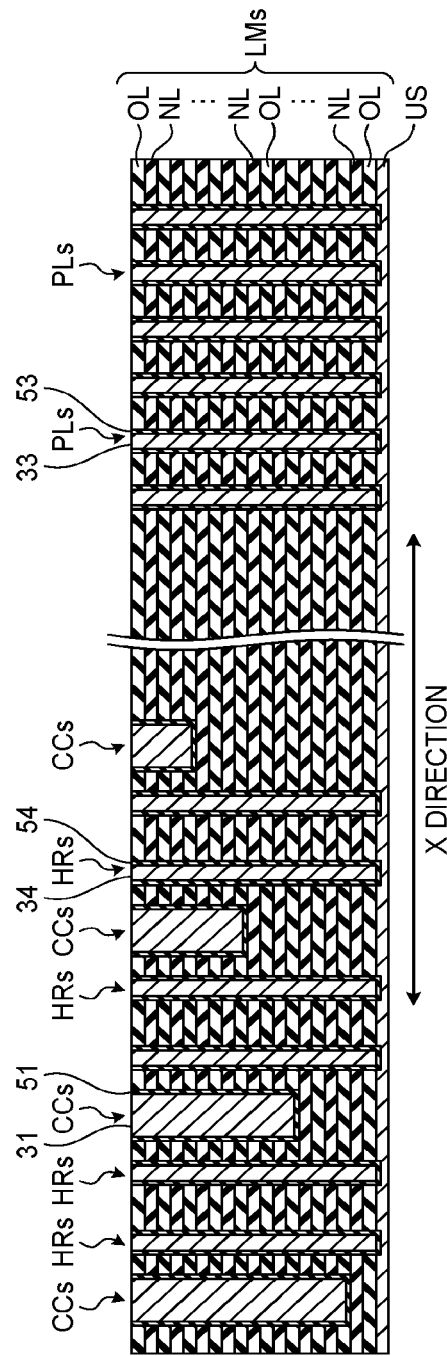
FIGS. 17A and 17B are cross-sectional views illustrating an example of the procedure of the manufacturing method of the semiconductor memory device according to the embodiment.
Figure 17B:
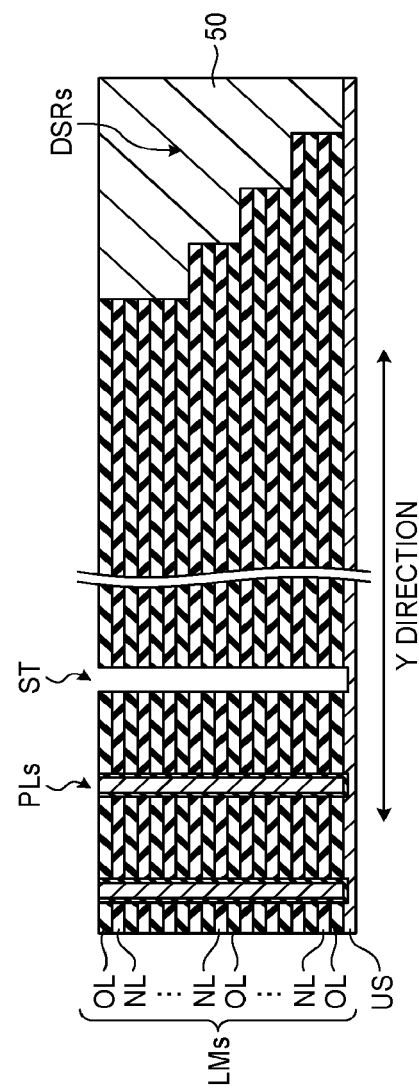

As illustrated in FIGS. 17A and 17B, an excess insulation layer 50 on the upper surface of the stacked body LMs is removed such that the insulation layer 50 of the stair portion DSRs is made substantially equal in height to the upper surface of the stacked body LMs, for example.

As illustrated in FIG. 17B, a slit ST extending in the X direction, penetrating the stacked body LMs, and reaching the understructure US is formed.

Figure 18A:
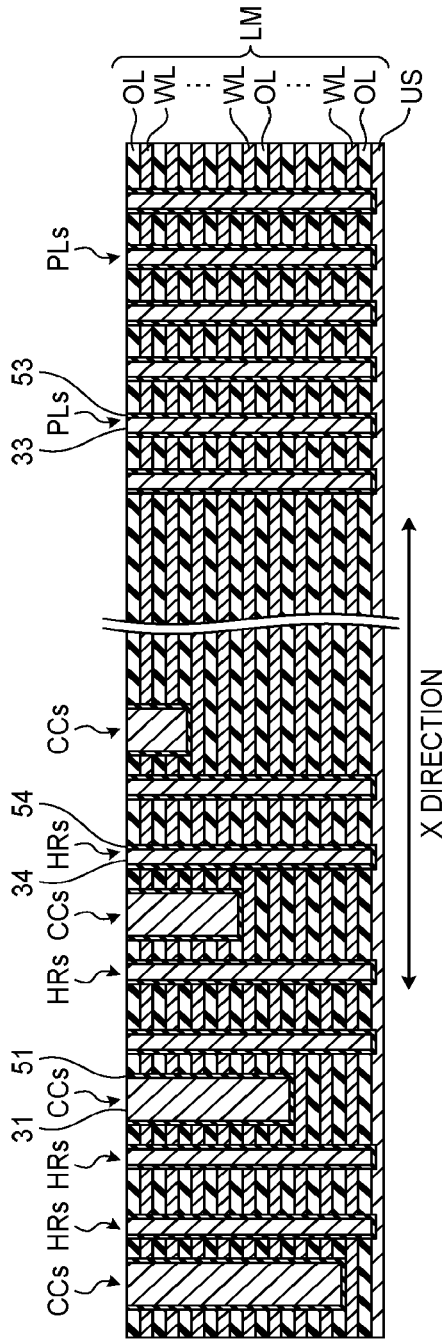
FIGS. 18A and 18B are cross-sectional views illustrating an example of the procedure of the manufacturing method of the semiconductor memory device according to the embodiment.
Figure 18B:
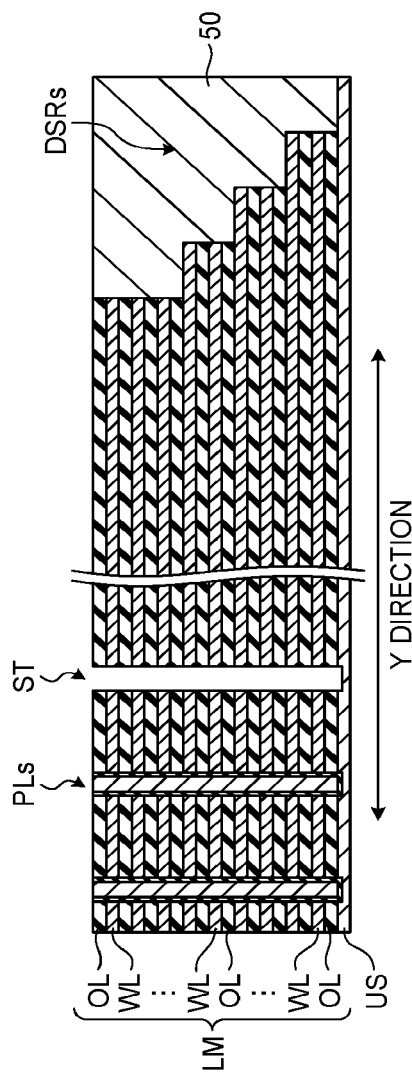

As illustrated in FIGS. 18A and 18B, the sacrificial layer NL of the stacked body LMs is replaced with the word line WL via the slit ST. Specifically, the sacrificial layer NL is removed via the slit ST, and a void between the insulation layers OL formed by removing the sacrificial layer NL is filled with a conductive material, and the stacked body LM in which the word line WL is formed between the insulation layers OL is formed.

It is to be noted that the processing illustrated in FIGS. 17A and 17B, and FIGS. 18A and 18B is sometimes referred to as a replace processing. It is to be noted that at the time of the replace processing, the stacked body LMs has a fragile structure having a void from which the sacrificial layer NL has been removed. At this time, the pillar PLs supports the stacked body LMs in the region that will later become the memory region MR, and the columnar portion HRs supports the stacked body LMs in the region that will later become the drawn-out portion SSR.

Figure 19:
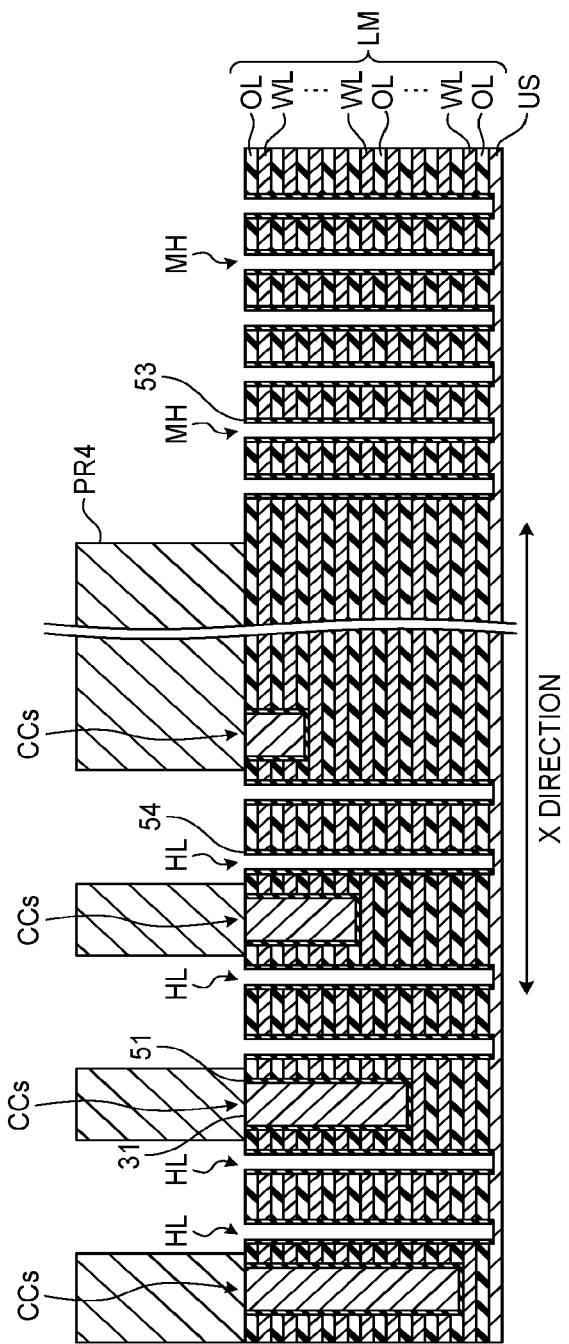
FIG. 19 is a cross-sectional view illustrating an example of the procedure of the manufacturing method of the semiconductor memory device according to the embodiment.

As illustrated in FIG. 19, a mask pattern PR4 on which a pattern is formed on, for example, a photoresist layer or the like is formed on the stacked body LM. The mask pattern PR4 covers all the contacts CCs.

In this way, in a state where all the contacts CCs are protected, the sacrificial layers 33 and 34 are removed from the memory hole MH and the hole HL, respectively, and the insulation layers 53 and 54 on the bottom surfaces of the memory hole MH and the hole HL are removed.

Figure 20:
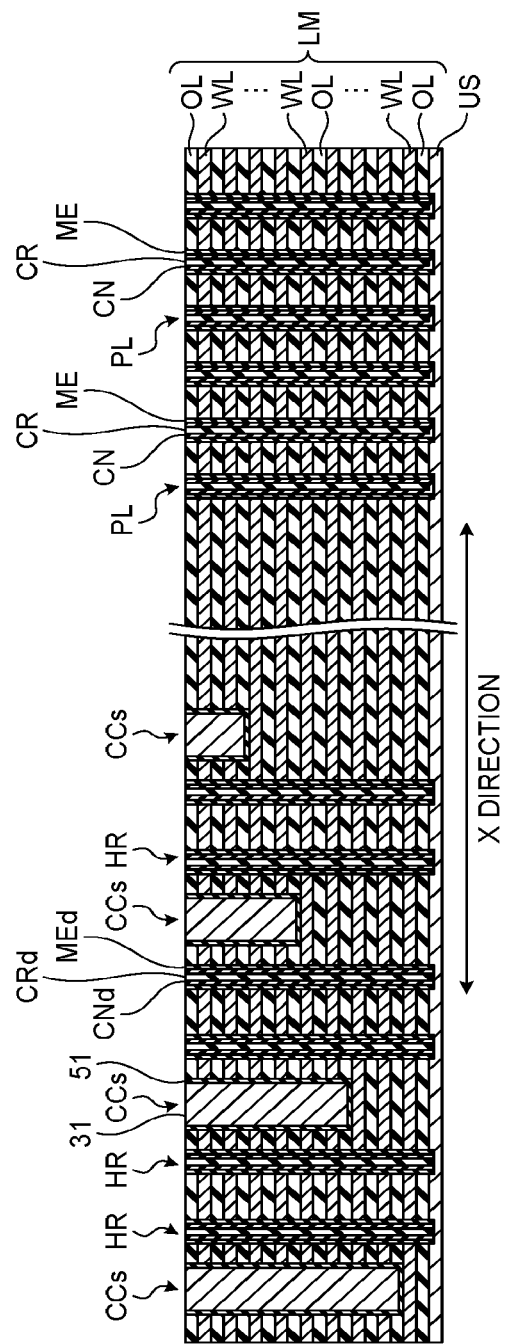
FIG. 20 is a cross-sectional view illustrating an example of the procedure of the manufacturing method of the semiconductor memory device according to the embodiment.

As illustrated in FIG. 20, a $SiO_2$ layer or the like, a SiN layer or the like, a $SiO_2$ layer or the like, and an amorphous silicon layer or a polysilicon layer, or the like are formed in the memory hole MH and the hole HL in order from the inner wall surfaces of the memory hole MH and the hole HL, and, for example, a $SiO_2$ layer is filled in the void at the center.

Thus, the pillar PL in which the memory layer ME, the channel layer CN, and the core layer CR are formed in order from the inner wall surface of the memory hole MH is formed. The channel layer CN is arranged also on the bottom surface of the memory hole MH. In addition, the columnar portion HR in which the dummy layers MEd, CNd, and CRd are formed in order from the inner wall surface of the hole HL is formed.

It is to be noted that the side surfaces of the memory hole MH and the hole HL may still have the insulation layers 53 and 54. In addition, a part or the entirety of the insulation layer 53 may be diverted to an outermost-peripheral $SiO_2$ layer or the like of the memory layer ME.

Figure 21:
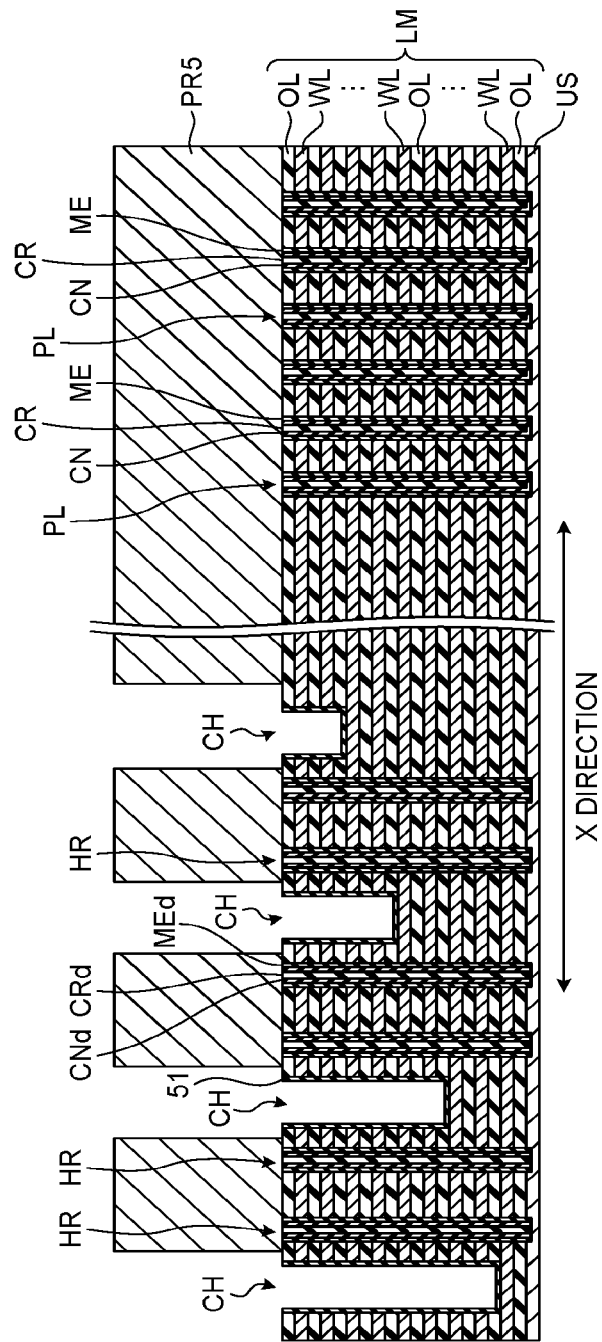
FIG. 21 is a cross-sectional view illustrating an example of the procedure of the manufacturing method of the semiconductor memory device according to the embodiment.

As illustrated in FIG. 21, a mask pattern PR5 on which a pattern is formed on, for example, a photoresist layer is formed on the stacked body LM. The mask pattern PR5 covers all the pillars PL and the columnar portions HR.

In this way, in a state where all the pillars PL and the columnar portions HR are protected, the sacrificial layer 31 is removed from the contact hole CH.

Figure 22:
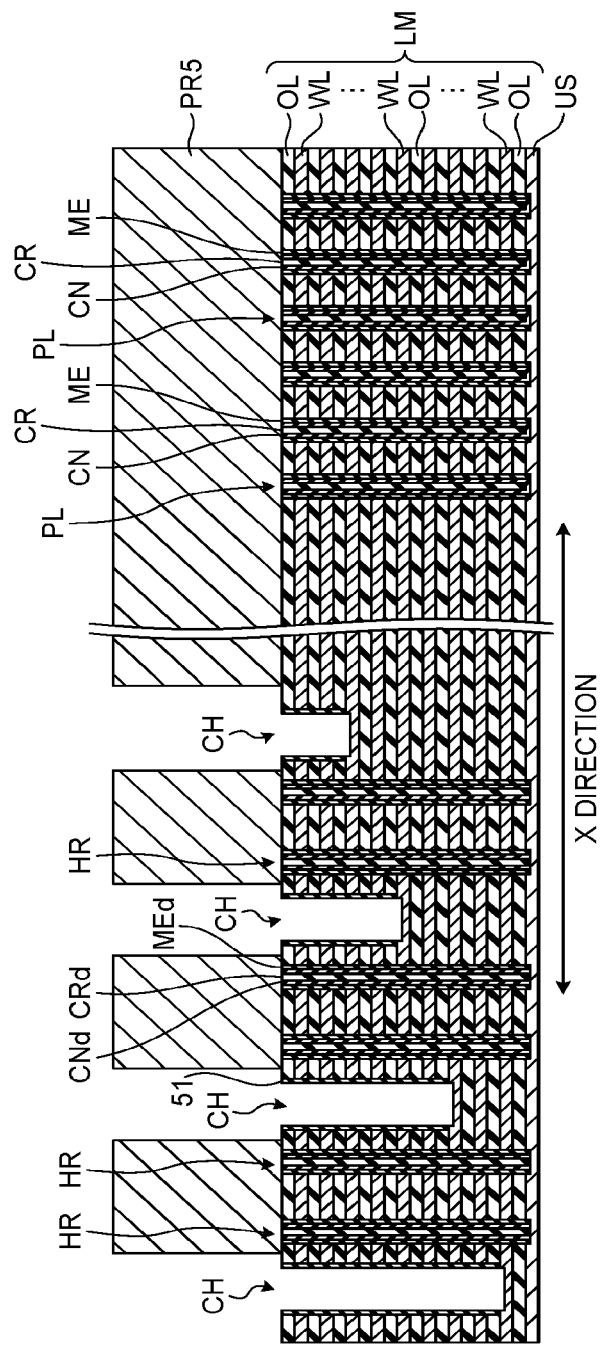
FIG. 22 is a cross-sectional view illustrating an example of the procedure of the manufacturing method of the semiconductor memory device according to the embodiment.

As illustrated in FIG. 22, the insulation layer 51 on the bottom surface of the contact hole CH is removed while all of the pillars PL and the columnar portions HR are protected by the mask pattern PR5.

As illustrated in FIG. 23, the conductive layer 21 such as a tungsten layer is filled inside the insulation layer 51 on the inner wall surface of the contact hole CH. Due to this, the plurality of contacts CC connected to the word lines WL at different levels are formed.

It is to be noted that two lines of the contacts CC that are arranged in the Y direction to be parallel and connected to the word lines WL at different levels by one layer can be formed in parallel by the above processing. In this case, for example, prior to the processing of FIGS. 5A and 5B, the stacked body LMs at the position where the contact CC of one line is formed is dug down by one pair of the sacrificial layer NL and the insulation layer OL, thereby forming two lines of the contacts CC having the connected word line different by one layer.

By forming the memory hole MH, the contact hole CH, and the hole HL while causing the mask patterns PR2 and PR2a to PR2c to retreat, at least any of the memory hole MH, the contact hole CH, and the hole HL may have a predetermined shape. In addition, at least any of the pillar PL, the contact CC, and the columnar portion HR formed from the memory hole MH, the contact hole CH, and the hole HL, respectively, may have a predetermined shape. FIGS. 24A and 24B illustrate an example thereof.

As illustrated in FIG. 24A, by repeating etching while causing the mask patterns PR2, and PR2a to PR2c to retreat, slight side etch may occur in each layer of the sacrificial layer NL exposed in the memory hole MH, the contact hole CH, and the hole HL. Therefore, the inner wall surface of at least any of the memory hole MH, the contact hole CH, and the hole HL may have an uneven shape with a recess by retreat of the sacrificial layer NL and a protrusion by projection of the insulation layer OL.

As illustrated in FIG. 24B, the sacrificial layer NL in which side etch has occurred is replaced by the word line WL, whereby the shape of the sacrificial layer NL is taken over by the word line WL, and the side surface (outer wall surface) of at least any of the pillar PL, the contact CC, and the columnar portion HR may have an uneven shape of a protrusion by retreat of the word line WL and a recess by projection of the insulation layer OL.

In addition, by forming the plurality of contact holes CH while causing the mask patterns PR2, and PR2a to PR2c to retreat, the diameters of the contact holes CH arranged toward the direction in which the mask patterns PR2, and PR2a to PR2c retreat may have a tendency of decreasing or increasing.

Thereafter, the insulation layer 52 is formed on the inner wall of the slit ST, and the conductive layer 22 is filled inside the insulation layer 52, whereby the contact LI is formed. In addition, the upper-layer wiring such as a bit line connected to the channel CN of the pillar PL and the upper-layer wiring connected to the contacts LI and CC are formed.

Thus, the semiconductor memory device 1 of the embodiment is manufactured.

In the manufacturing process of the semiconductor memory device such as a three-dimensional nonvolatile memory, a stair portion in which sacrificial layer that are stacked at different levels and will later become word lines are drawn out stepwise may be formed. The contact for electrically drawing out the word lines to the peripheral circuit is formed at each step of the stair portion. However, when the arrangement position of the contact is deviated from each step, the contact may not be connected to the word line.

In addition, in the vicinity of the contact of the stair portion, a plurality of columnar portions may be arranged in a matrix in order to support the stacked body in the middle of the manufacturing process, for example. However, since the contact and the columnar portion are formed separately, the contact and the columnar portion may come into contact with each other because of misalignment between the contact and the columnar portion or because the contact hole is formed a tilt at the time of forming the contact.

In addition, in the manufacturing process of the semiconductor memory device, the shape of the dummy stair portion may become irregular or steep by processing the stacked body by repeating the formation and peeling off of the mask pattern for a plurality of times. This is because the position of the end of the mask pattern in the dummy stair portion varies every time the mask pattern is formed because precise alignment of the mask pattern is not normally carried out in the position of the dummy stair portion, or the like. When the dummy stair portion having an irregular or steep shape is backfilled, unevenness called notching is likely to occur on the upper surface of the insulation layer, and the dummy stair portion may not be backfilled in flat.

According to the manufacturing method of the semiconductor memory device 1 of the embodiment, etching is performed by sequentially exposing the openings OPc of the mask pattern HM while causing the mask pattern PR2 to retreat. This allows each contact hole CH to reach the sacrificial layer NL belonging to a different level without forming a stair portion in which the sacrificial layer is drawn out in a stepwise shape. Accordingly, it is possible to more reliably connect the contact CC with the word line WL.

According to the manufacturing method of the semiconductor memory device 1 of the embodiment, the mask pattern HM has the opening OPc for forming the contact CC and the opening OPh for forming the columnar portion HR. Due to this, since the contact CC and the columnar portion HR are formed from one mask pattern HM, it is possible to suppress misalignment between the contact CC and the columnar portion HR from occurring. In addition, since the contact CC and the columnar portion HR are formed in parallel, it is suppressed that only the contact CC is inclined and comes into contact with the columnar portion HR.

According to the manufacturing method of the semiconductor memory device 1 of the embodiment, the processing of the stacked body LMs is performed by mainly using the mask pattern PR2 and the mask patterns PR2a to PR2c obtained by slimming the mask pattern PR2. Due to this, the dummy stair portion DSR can be formed into a gentle and regular shape as compared with, for example, the case where formation of the mask pattern is repeated a plurality of times, and the unevenness on the upper surface of the insulation layer 50 can be suppressed.

It is to be noted that while in the embodiment described above, the semiconductor memory device 1 includes the two lines of the contacts CC toward the memory region MR, the arrangement of the contacts CC is not limited to this. The semiconductor memory device may be configured to have one line of contacts toward the memory region MR, so that the word lines connected to the contacts are shifted to the word lines upper by one layer toward the memory region MR. Alternatively, the semiconductor memory device may be configured to have three or more lines of contacts toward the memory region MR, so that the word lines connected to the contacts are shifted to the word lines upper by three or more layers toward the memory region MR.

In the embodiment described above, the first layer is the sacrificial layer NL and is later replaced with the word line WL, which is a conductive layer. However, the first layer is not limited thereto. From the initial stage of the manufacturing process of the semiconductor memory device, a stacked body in which a conductive layer such as a polysilicon layer as the first layer and an insulation layer are alternately stacked may be formed. Due to this, the first layer may be used as a word line or the like without being replaced with another layer.

In the embodiment described above, the semiconductor memory device 1 includes the columnar portion HR filled with the material similar to that of the pillar PL. However, the configuration of the columnar portion HR is not limited thereto. For example, the columnar portion may be filled with a single insulation layer such as a $SiO_2$ layer. In addition, if the columnar portion HR and the contact CC can be formed in parallel, the pillar PL may be formed in a process other than those.

In the embodiment described above, the semiconductor memory device 1 includes a peripheral circuit arranged on a substrate such as a silicon substrate. In the embodiment described above, if the understructure US in which the stacked body LM and the like are arranged is a semiconductor substrate or the like, the peripheral circuit can be arranged outside the stacked body LM in parallel with the stacked body LM. If the understructure US is a source line or the like, the peripheral circuit may be arranged below the source line in which the stacked body LM is arranged. Alternatively, the stacked body LM may be bonded to the substrate on which the peripheral circuit is arranged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor memory device, comprising:
    forming a stacked body in which a plurality of first layers are stacked while being separated from one another;
    forming a first mask pattern having a first opening and a plurality of second openings above the stacked body;
    forming a second mask pattern covering some of the plurality of second openings; and
    etching the stacked body with the first mask pattern as a mask while sequentially exposing the plurality of second openings by causing an end of the second mask pattern to retreat to form a first hole extending in the stacked body in a stacking direction of the stacked body at a position of the first opening and form a plurality of second holes extending in the stacked body to different depths in the stacking direction at positions of the plurality of second openings, and reaching first layers of the plurality of first layers at different levels, wherein
    the first opening is one of a plurality of first openings, the second mask pattern exposing a region as a whole in which the plurality of first openings are provided,
    the first hole is one of a plurality of first holes, and
    etching the stacked body includes:
        forming the plurality of first holes reaching the same level with each other from an uppermost layer of the stacked body at positions each corresponding to one of the plurality of first openings.

2. The manufacturing method of a semiconductor memory device according to claim 1, wherein
    forming the plurality of second holes includes:
        causing the end of the second mask pattern to retreat to expose an opening of the plurality of second openings at an n-th position, toward a retreat direction of the second mask pattern, from an end position of the second mask pattern before causing the end of the second mask pattern to retreat, and etching the stacked body to cause an n-th second hole to penetrate m layers from the uppermost layer, n and m each being an integer equal to or greater than 1;
        causing the end of the second mask pattern to retreat to expose an opening of the plurality of second openings at an (n+1)-th position from the end position toward the retreat direction, and etching the stacked body to cause the n-th second hole to penetrate 2m layers from the uppermost layer, and cause an (n+1)-th second hole to penetrate m layers from the uppermost layer; and
        causing the end of the second mask pattern to retreat to expose an opening of the plurality of second openings at an (n+2)-th position from the end position toward the retreat direction, and etching the stacked body to cause the n-th second hole to penetrate 3m layers from the uppermost layer, cause the (n+1)-th second hole to penetrate 2m layers from the uppermost layer, and cause an (n+2)-th second hole to penetrate m layers from the uppermost layer.

3. The manufacturing method of a semiconductor memory device according to claim 2, wherein
    forming the plurality of first holes includes:
        causing each of the plurality of first holes to penetrate at least m layers from the uppermost layer when causing the n-th second hole to penetrate m layers from the uppermost layer;
        causing each of the plurality of first holes to penetrate at least 2m layers from the uppermost layer when causing the (n+1)-th second hole to penetrate m layers from the uppermost layer; and
        causing each of the plurality of first holes to penetrate at least 3m layers from the uppermost layer when causing the (n+2)-th second hole to penetrate m layers from the uppermost layer.

4. The manufacturing method of a semiconductor memory device according to claim 2, wherein
    the first mask pattern:
        has the first opening in a first region on the stacked body;
        has the plurality of second openings in a second region different from the first region; and
        further has a plurality of third openings in the second region, and
    when the first hole and the second holes are formed, a plurality of third holes extending in the stacked body in the stacking direction are formed at positions of the plurality of third openings.

5. The manufacturing method of a semiconductor memory device according to claim 4, wherein
the plurality of third holes reaching the same level with each other from the uppermost layer are formed at positions each corresponding to one of the plurality of third openings.

6. The manufacturing method of a semiconductor memory device according to claim 5, wherein
forming the plurality of third holes includes:
causing each of the plurality of third holes to penetrate at least m layers from the uppermost layer when causing the n-th second hole to penetrate m layers from the uppermost layer,
causing each of the plurality of third holes to penetrate at least 2m layers from the uppermost layer when causing the (n+1)-th second hole to penetrate m layers from the uppermost layer, and
causing each of the plurality of third holes to penetrate at least 3m layers from the uppermost layer when causing the (n+2)-th second hole to penetrate m layers from the uppermost layer.

7. The manufacturing method of a semiconductor memory device according to claim 1, wherein the first hole is a memory hole for forming a plurality of memory cells along a height direction in the stacked body.

8. The manufacturing method of a semiconductor memory device according to claim 1, wherein the plurality of second holes are contact holes for forming contacts electrically connected to a plurality of memory cells at different height positions respectively.

9. The manufacturing method of a semiconductor memory device according to claim 4, wherein the plurality of third holes are holes for forming columnar portions to support the stacked body.

10. The manufacturing method of a semiconductor memory device according to claim 1, wherein
the plurality of first layers are sacrificial layers, and
the method further comprises replacing the plurality of first layers with conductive layers after forming the first hole and the second holes.

11. The manufacturing method of a semiconductor memory device according to claim 1, wherein the plurality of first layers are conductive layers.

12. The manufacturing method of a semiconductor memory device according to claim 1, wherein the first mask pattern includes an inorganic material.

13. The manufacturing method of a semiconductor memory device according to claim 12, wherein the second mask pattern includes an organic material.

14. A manufacturing method of a semiconductor memory device, comprising:
forming a stacked body in which a plurality of first layers are stacked while being separated from one another;
forming a first mask pattern having a first opening and a plurality of second openings above the stacked body;
forming a second mask pattern covering some of the plurality of second openings; and
etching the stacked body with the first mask pattern as a mask while sequentially exposing the plurality of second openings by causing an end of the second mask pattern to retreat to for a first hole extending in the stacked body in a stacking direction of the stacked body at a position of the first opening and form a plurality of second holes extending in the stacked body to different depths in the stacking direction at positions of the plurality of second openings, and reaching first layers of the plurality of first layers at different levels, wherein
forming the plurality of second holes includes:
causing the end of the second mask pattern to retreat to expose an opening of the plurality of second openings at an n-th position, toward a retreat direction of the second mask pattern, from an end position of the second mask pattern before causing the end of the second mask pattern to retreat, and etching the stacked body to cause an n-th second hole to penetrate m layers from an uppermost layer of the stacked body, n and m each being an integer equal to or greater than 1;
causing the end of the second mask pattern to retreat to expose an opening of the plurality of second openings at an (n+1)-th position from the end position toward the retreat direction, and etching the stacked body to cause the n-th second hole to penetrate 2m layers from the uppermost layer, and cause an (n+1)-th second hole to penetrate m layers from the uppermost layer; and
causing the end of the second mask pattern to retreat to expose an opening of the plurality of second openings at are (n+2)-th position from the end position toward the retreat direction, and etching the stacked body to cause the n-th second hole to penetrate 3m layers from the uppermost layer, cause the (n+1)-th second hole to penetrate 2m layers from the uppermost layer, and cause an (n+2)-th second hole to penetrate m layers from the uppermost layer,
the first opening is one of a plurality of first openings,
the first hole is one of a plurality of first holes,
etching the stacked body includes:
forming the plurality of first holes reaching the same level with each other from the uppermost layer at positions each corresponding to one of the plurality of first openings, and
forming the plurality of first holes includes:
causing each of the plurality of first holes to penetrate at least m layers from the uppermost layer when causing the n-th second hole to penetrate m layers from the uppermost layer;
causing each of the plurality of first holes to penetrate at least 2m layers from the uppermost layer when causing the (n+1)-th second hole to penetrate m layers from the uppermost layer; and
causing each of the plurality of first holes to penetrate at least 3m layers from the uppermost layer when causing the (n+2)-th second hole to penetrate m layers from the uppermost layer.

* * * * *